(12) United States Patent
Parvarandeh

(10) Patent No.: US 10,672,748 B1
(45) Date of Patent: Jun. 2, 2020

(54) USE OF DEVICE ASSEMBLY FOR A GENERALIZATION OF THREE-DIMENSIONAL HETEROGENEOUS TECHNOLOGIES INTEGRATION

(75) Inventor: Pirooz Parvarandeh, Los Altos Hills, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 7 days.

(21) Appl. No.: 13/225,289

(22) Filed: Sep. 2, 2011

Related U.S. Application Data

(63) Continuation-in-part of application No. 12/792,565, filed on Jun. 2, 2010, now Pat. No. 8,349,653.

(51) Int. Cl.
*H01L 25/10* (2006.01)
*H01L 23/00* (2006.01)
(Continued)

(52) U.S. Cl.
CPC .............. *H01L 25/10* (2013.01); *H01L 21/70* (2013.01); *H01L 24/82* (2013.01); *H01L 24/95* (2013.01); *H01L 25/0657* (2013.01); *H01L 21/673* (2013.01); *H01L 23/13* (2013.01); *H01L 24/19* (2013.01); *H01L 24/94* (2013.01); *H01L 25/18* (2013.01); *H01L 25/50* (2013.01)

(58) Field of Classification Search
CPC ......... H01L 25/10; H01L 21/70; H01L 24/82; H01L 24/95; H01L 2924/15153; H01L 2224/97
USPC .................................. 257/777, 685, 686, 774
See application file for complete search history.

(56) References Cited

U.S. PATENT DOCUMENTS 5,111,278 A * 5/1992 Eichelberger ......... H01L 23/473
257/698
5,121,176 A 6/1992 Quigg
(Continued)

FOREIGN PATENT DOCUMENTS

JP 2004-135163 A 4/2004

OTHER PUBLICATIONS

Notice of Publication dated Dec. 8, 2011, U.S. Appl. No. 12/792,565, filed Jun. 2, 2010, Pirooz Parvarandeh.
(Continued)

*Primary Examiner* — Zandra V Smith
*Assistant Examiner* — Abbigale A Boyle
(74) *Attorney, Agent, or Firm* — Kevin E. West; Advent, LLP

(57) ABSTRACT

A composite structure is a stack of thinned substrates each having a plurality of active devices of the same or different technologies. An assembled carrier substrate includes die assembled into cavities formed on the carrier substrate such that when the die rest within the cavity, a gap is formed between a bottom surface of the die and a bottom surface of the cavity. This gap removes contact stress applied to the bottom of the die. Another gap can also be formed above the die. Either gap can be filled with a low-stress material. A yield improvement process functionally and physically partitions a conceptual large area die into an array of separate die modules of smaller area. The separate die modules are assembled into an array of cavities formed in a carrier substrate and interconnected to achieve a combined functionality equivalent to the functionality of the conceptual large area die.

5 Claims, 11 Drawing Sheets

(51) Int. Cl.
*H01L 25/065* (2006.01)
*H01L 21/70* (2006.01)
*H01L 25/00* (2006.01)
*H01L 21/673* (2006.01)
*H01L 25/18* (2006.01)
*H01L 23/13* (2006.01)

(56) References Cited

U.S. PATENT DOCUMENTS

| | | |
|---|---|---|
| 5,252,848 A | 10/1993 | Adler et al. |
| 5,273,922 A | 12/1993 | Tsoi |
| 5,545,291 A | 8/1996 | Smith et al. |
| 5,585,294 A | 12/1996 | Smayling et al. |
| 5,719,085 A | 2/1998 | Moon et al. |
| 5,811,850 A | 9/1998 | Smayling et al. |
| 5,844,347 A | 12/1998 | Takayama et al. |
| 6,031,729 A * | 2/2000 | Berkely et al. ............... 361/771 |
| 6,091,110 A | 7/2000 | Herbert et al. |
| 6,117,704 A * | 9/2000 | Yamaguchi et al. .......... 438/100 |
| 6,118,167 A | 9/2000 | DiSimone et al. |
| 6,143,623 A | 11/2000 | Tsuda et al. |
| 6,144,069 A | 11/2000 | Tung |
| 6,242,787 B1 | 6/2001 | Nakayama et al. |
| 6,258,692 B1 | 7/2001 | Chu et al. |
| 6,274,508 B1 | 8/2001 | Jacobsen et al. |
| 6,281,038 B1 | 8/2001 | Jacobsen et al. |
| 6,291,896 B1 | 9/2001 | Smith |
| 6,307,447 B1 | 10/2001 | Barber et al. |
| 6,333,232 B1 | 12/2001 | Kunikiyo |
| 6,335,259 B1 | 1/2002 | Jeng |
| 6,399,461 B1 | 6/2002 | Liu et al. |
| 6,413,827 B2 | 7/2002 | Farrar |
| 6,417,025 B1 | 7/2002 | Gengel |
| 6,420,266 B1 | 7/2002 | Smith et al. |
| 6,444,541 B1 | 9/2002 | Lai et al. |
| 6,448,109 B1 | 9/2002 | Karpman |
| 6,455,399 B2 | 9/2002 | Malik et al. |
| 6,472,324 B2 | 10/2002 | Kusakabe et al. |
| 6,472,708 B1 | 10/2002 | Hshieh et al. |
| 6,479,395 B1 | 11/2002 | Smith et al. |
| 6,482,718 B2 | 11/2002 | Shiozawa et al. |
| 6,495,424 B2 | 12/2002 | Kunikiyo |
| 6,495,898 B1 | 12/2002 | Iwamatsu et al. |
| 6,501,148 B2 | 12/2002 | Tsuda et al. |
| 6,524,929 B1 | 2/2003 | Xiang et al. |
| 6,527,964 B1 | 3/2003 | Smith et al. |
| 6,528,395 B2 | 3/2003 | Nakamura |
| 6,541,382 B1 | 4/2003 | Cheng et al. |
| 6,555,408 B1 | 4/2003 | Jacobsen et al. |
| 6,566,744 B2 | 5/2003 | Gengel |
| 6,577,013 B1 * | 6/2003 | Glenn ................. H01L 23/3114 257/618 |
| 6,586,338 B2 | 7/2003 | Smith et al. |
| 6,596,607 B2 | 7/2003 | Ahn |
| 6,606,247 B2 | 8/2003 | Credelle et al. |
| 6,623,579 B1 | 9/2003 | Smith et al. |
| 6,624,016 B2 | 9/2003 | Wu |
| 6,657,289 B1 | 12/2003 | Craig et al. |
| 6,731,353 B1 | 5/2004 | Credelle et al. |
| 6,743,695 B2 | 6/2004 | Lee et al. |
| 6,747,333 B1 | 6/2004 | Xiang et al. |
| 6,750,117 B1 | 6/2004 | Hung et al. |
| 6,780,696 B1 | 8/2004 | Schatz |
| 6,781,194 B2 | 8/2004 | Baliga |
| 6,816,380 B2 | 11/2004 | Credelle et al. |
| 6,919,225 B2 | 7/2005 | Craig et al. |
| 6,979,621 B2 | 12/2005 | Hshieh et al. |
| 6,985,361 B2 | 1/2006 | Credelle et al. |
| 7,033,909 B2 | 4/2006 | Kim et al. |
| 7,080,444 B1 | 7/2006 | Craig et al. |
| 7,101,502 B2 | 9/2006 | Smith et al. |
| 7,112,513 B2 | 9/2006 | Smythe, III et al. |
| 7,126,193 B2 | 10/2006 | Baiocchi et al. |
| 7,141,176 B1 | 11/2006 | Smith et al. |
| 7,172,789 B2 | 2/2007 | Smith et al. |
| 7,211,900 B2 * | 5/2007 | Shin ....................... H01L 23/13 257/686 |
| 7,214,569 B2 | 5/2007 | Swindlehurst et al. |
| 7,215,033 B2 * | 5/2007 | Lee et al. ....................... 257/777 |
| 7,235,845 B2 | 6/2007 | Xu et al. |
| 7,244,326 B2 | 7/2007 | Craig et al. |
| 7,260,882 B2 | 8/2007 | Credelle et al. |
| 7,282,765 B2 | 10/2007 | Xu et al. |
| 7,288,432 B2 | 10/2007 | Jacobsen et al. |
| 7,291,541 B1 | 11/2007 | Foote |
| 7,297,582 B2 | 11/2007 | Abadeer et al. |
| 7,321,159 B2 | 1/2008 | Schatz |
| 7,353,598 B2 | 4/2008 | Craig et al. |
| 7,452,748 B1 | 11/2008 | Craig et al. |
| 7,479,688 B2 | 1/2009 | Deshpande et al. |
| 7,504,676 B2 | 3/2009 | Bhalla et al. |
| 7,531,218 B2 | 5/2009 | Smith et al. |
| 7,542,301 B1 | 6/2009 | Liong et al. |
| 7,576,433 B2 * | 8/2009 | Ishino et al. .................. 257/777 |
| 7,589,412 B2 * | 9/2009 | Kashimoto et al. .......... 257/693 |
| 7,615,479 B1 | 11/2009 | Craig et al. |
| 7,768,113 B2 * | 8/2010 | Ozguz ................. H01L 21/4846 257/686 |
| 8,772,087 B2 * | 7/2014 | Barth ..................... H01L 21/568 438/112 |
| 2002/0197823 A1 | 12/2002 | Yoo et al. |
| 2004/0115881 A1 | 6/2004 | Choi et al. |
| 2006/0141731 A1 | 6/2006 | Kim |
| 2006/0183295 A1 | 8/2006 | Yoo et al. |
| 2006/0210769 A1 | 9/2006 | Swindlehurst et al. |
| 2006/0267213 A1 * | 11/2006 | Ozguz ................. H01L 21/4846 257/777 |
| 2007/0032029 A1 | 2/2007 | Chow et al. |
| 2007/0138548 A1 | 6/2007 | Kocon et al. |
| 2007/0254453 A1 | 11/2007 | Ang |
| 2008/0124890 A1 | 5/2008 | Wu et al. |
| 2008/0265383 A1 * | 10/2008 | Brunnbauer .......... H01L 21/561 257/659 |
| 2008/0286936 A1 | 11/2008 | Zhao |
| 2008/0293213 A1 | 11/2008 | Yang et al. |
| 2009/0039523 A1 * | 2/2009 | Jiang et al. ................... 257/777 |
| 2009/0160065 A1 * | 6/2009 | Haba ................. H01L 21/6835 257/777 |
| 2010/0258944 A1 * | 10/2010 | Uchiyama .......... H01L 23/5384 257/773 |

OTHER PUBLICATIONS

Tapani Makkonen, Tuomas Pensala, Juha Vartiainen, Jouni V. Knuuttila, Jyrki Kaitila, Martti M. Salomaa, "Estimating Materials Parameters in Thin-Film BAW Resonators Using Measured Dispersion Curves," Jan. 2004, pp. 42-51, IEEE, vol. 51., No. 1.

Examination Notification and Search Report completed Aug. 5, 2015 for Taiwan Application No. 100115134.

* cited by examiner

USE OF DEVICE ASSEMBLY FOR A GENERALIZATION OF THREE-DIMENSIONAL HETEROGENEOUS TECHNOLOGIES INTEGRATION

RELATED APPLICATIONS

This Patent Application is a continuation in part of U.S. patent application Ser. No. 12/792,565, filed Jun. 2, 2010, and entitled, "THE USE OF DEVICE ASSEMBLY FOR A GENERALIZATION OF THREE-DIMENSIONAL METAL INTERCONNECT TECHNOLOGIES." This application incorporates U.S. patent application Ser. No. 12/792,565 in its entirety by reference.

FIELD OF THE INVENTION

The present invention relates to the field of semiconductor device assembly. More particularly, the present invention relates to the field of semiconductor device assembly and three-dimensional metal interconnect technologies.

BACKGROUND OF THE INVENTION

Circuit miniaturization and system miniaturization are well known goals in the electronics industry. Much miniaturization takes place by increasing integration onto a single semiconductor die, commonly known as an integrated circuit or as a chip. As is well known, some circuit functions are better performed by chips formed on one type of semiconductor process whereas other circuit functions are better performed by chips formed on a different type of semiconductor process. Examples of such disparate circuit functions include analog versus digital circuits, and also high power versus low power circuit applications. Generally, a single chip cannot be manufactured with two or more different semiconductor processes.

To miniaturize an electronic system having chips formed using different semiconductor fabrication technologies, a trend in the integrated circuit industry is to electrically couple such circuits together. Currently, the industry has techniques for positioning two die side by side, each die of a different fabrication technology. Each die is picked and placed into a package. There are bonding wires that connect each die to external connections and/or to each other. This is referred to as a side by side technique. Another technique for joining two disparate chips together is to stack a first die on top of a second die, usually both die are face up. Each of these two die are electrically coupled to external connections and/or interconnected via bond wires. This is referred to as a stacked die technique. A modification of the stacked die technique is that the first die is configured as a flip-chip die. To assemble the first die and the second die, the first die is flipped upside down, then picked and placed onto the top of the second die, such that the "top" surface, now upside down, of the first die is placed on the top surface of the second die. The interface surfaces of both the first die and the second die are configured with solder ball interconnects such that some level of interconnect is formed between the first die and the second die when assembled. This modified stacked die technique can be performed using a CSP (Chip Scale Package) type technology. In either the side by side technique or the stacked die technique, the first die is singulated meaning the wafer on which the first die was fabricated has been cut to form separate, individual die, the second die is singulated, and the assembly process requires some means to pick and place the two together and connect them. An advantage of the side by side technique and the stacked die technique is that all die can be pre-tested for proper functionality, and are therefore known good die.

Another technique for connecting disparate type die is a wafer bonding technique, which forms three-dimensional metal interconnects between die on the wafers being bonded. In some cases, such three-dimensional metal interconnects include through silicon vias. The wafer bonding technique bonds together a first wafer and a second wafer, where the second wafer has die of a different technology than the die on the first wafer, but the die on both wafers have the same size, spacing, and repetition rate. There are exposed metal interconnects on a surface of each die for both the first wafer and the second wafer. The two wafers are placed together so that the surfaces with exposed metal interconnects face each other. The two wafers are bonded together and the interconnects of the interfacing surfaces of the two wafers are intimately connected. This bonds one die, on the first wafer, on top of another die, on the second wafer. The bonded wafer stack is then cut to singulate the individual die stacks. The bonding of the two wafers is done according to the chemical compositions of the two wafers. There are other chemistries that can be used. For example, there can be other types of material(s) that are deposited on the wafers so that when the two wafers are bonded together, the melting temperature for those interface materials is used. Other bonding techniques can be used that are well known in the art.

One advantages of the wafer bonding technique is that a high density of interconnects can be achieved between the two wafers because the wafers typically have very fine geometry resolution interconnects and therefore the metalization between the two wafers is at a small level. In comparison to the stacked die technique that uses solder balls, where the solder balls are typically 100 microns or more in diameter, has a number of interconnects that is much more limited. As such, the parasitic characteristics associated with the interconnects are lower using the wafer bonding technique than the stacked die technique. Also, the stacked die technique uses a pick and place process, where each die is individually placed. In contrast, the wafer bonding technique uses a batch process, so there is economies of scale.

The wafer bonding technique has several disadvantages. First, the wafer bonding technique requires that each die on the first wafer is equal in size to each die on the second wafer. If the die are not the same size, the small die will require wasted space be formed between adjacent die to provide the same spacing as for the larger die on the other wafer. Second, the wafer bonding technique requires that the first wafer is equal in size to the second wafer. Third, the bonding of two wafers limits interfacing to two separate technologies, a first technology of the first wafer, such as CMOS formed of silicon technology, and a second technology of the second wafer, such as Galium Arsenide (GaAs) or Galium Nitride (GaN). However, the face-to-face interface of the first and second wafers does not enable a configuration to introduce a third, or more, additional technology. A fourth disadvantage of the wafer bonding technique is that the die on each wafer are not pre-tested for proper functionality, and are therefore subject to yield constraints for both the first wafer and the second wafer. In other words, there is a first defect density associated with the first wafer, and there is a second defect density associated with the second wafer. Stacking and bonding the two wafers means the resulting die stacks have defect densities that are cumulative of both the first wafer and the second wafer. A die stack with a first die from the first wafer and a second die from the second wafer may be defective if either the first die is defective or the second die is defective.

If the conditions for wafer bonding are not met, then it is possible to singulate the die of the first wafer and to attach the singulated first die to the second die still part of the second wafer using a pick and place technique. Pick and place machines are robotic machines used to place surface-mount devices onto a printed circuit board (PCB) or other substrate. This technique has the disadvantage that it is not done in batch mode. Another disadvantage is that applications requiring precise placement necessitate high resolution, high precision robotic equipment to properly align and place the singulated first die on the second die.

Fluidic self-assembly is a process by which die are added to a fluid solution, which is then distributed across a substrate. One type of fluidic self-assembly is a shaped-based technique. Cavities of a specified shape and size are formed in a top surface of the substrate. The shape and size of the die and the corresponding cavities are such that a die falls into a cavity according to a specific alignment, thereby self-aligning.

FIG. 1 illustrates a cut-out side view of a substrate 2 having a plurality of cavities 4 formed in a top surface 6 of the substrate 2. In an exemplary configuration, a cut-out side profile of each cavity is trapezoidal in shape. In the case of silicon, the trapezoidal shape is a result of a standard etching process that creates sidewalls with very precise angles. As shown in FIG. 1, each of the trapezoidal-shaped cavities has sides 8 that taper inward moving downward from the top surface 6. As is well known, the trapezoidal-shaped cavities can be formed using an appropriate etch process on a surface of a silicon wafer in a proper crystal orientation. The number and positions of the cavities are formed according to a specified pattern across the top surface of the substrate. The cavities are formed such that correspondingly shaped and sized die can be positioned within the cavities accordingly to a specific alignment. The die are fabricated from a second substrate using known semiconductor integrated circuit fabrication technology. Once singulated, the die have a shape and size complimentary to the cavities 4 in the substrate 2, for example the trapezoidal cross section shape and a size to correspond to the cavities 4. In some embodiments, the active circuitry of each die is on the elongated, or top surface, of the trapezoidal shape. The plurality of singulated die are placed in a fluid, typically water. The substrate 2 is positioned at an angle, such as shown in FIG. 2, and the fluid with die 10 is poured down the angled substrate 2 so that the die are gravity fed down the face of the angled substrate. Because the cavities 4 on the substrate 2 are trapezoidal-shaped, and the die 10 have the same trapezoidal shape, and because the cavities 4 have a predetermined size, and the die 10 have the corresponding size, there is only one orientation where a die 10 fits within a cavity 4, thereby self-assembling the die 10 within the substrate 2.

Referring to FIGS. 1 and 2, a die 10 can only fall into the cavity 4 with the bottom, narrower portion of the die positioned at the bottom of the cavity and the top, wider portion of the die positioned at the top of the cavity. In other words, the die is positioned narrow-side down in the cavity. Referring to FIG. 2, only the left hand die 10 is oriented properly to fit within one of the cavities 4. The other two die shown are not properly aligned and therefore will not properly fall within any of the cavities 4 while in their current alignment. During fluid flow, the die are constantly moving and therefore shifting their alignment. Any die 10 that do not fall into a cavity 4 on the substrate 2 are recirculated to flow back down the angled substrate 2. This cycling can be performed as many times as desired, until all the cavities 4 on the substrate 2 are filled with die 10, such as shown in FIG. 3. The cavities and die can be configured to properly align in the z-direction (top and bottom surfaces) and also in the x and y-directions such that each specific side of the die is aligned with a specific side of the cavity. In general, the die and the cavities are fabricated with geometries that allow the die to fit correctly and to be properly oriented within the cavity.

The die can be held in place within the cavities by pre-applying a surface treatment within the cavity prior to self-assembly, or by applying a securing means to the die after self-assembly, such as adhesive, solder, or a strap. Electrical connections can be made to the die assembled in the substrate. For example, bonding wires are added to electrically connect the die to metal interconnects on the substrate.

SUMMARY OF THE INVENTION

Embodiments are directed to a composite structure and method of assembling the composite structure, where the composite structure is a stack of thinned substrates each having a plurality of active devices. The active devices can be of the same or different technologies.

Embodiments are further directed to an assembled carrier substrate in which die are assembled into cavities formed on the carrier substrate such that when the die rest within the cavity, a gap is formed between a bottom surface of the die and a bottom surface of the cavity. This gap removes contact stress applied to the bottom of the die. In some embodiments, a low-stress material is added in the gap. In other embodiments, the gap is left as an open space. In some embodiments, the die is configured such that a top surface is below a top surface of the carrier substrate, thereby forming a gap above the die. This can be filled with low-stress material or be left as open space. In some embodiments, the die is a micro-electro-mechanical system (MEMS) device having a movable element that moves within either the gap above the die, the gap below the die, or both gaps.

Embodiments are still further directed to a yield improvement process whereby a conceptual large area die is functionally and physically partitioned into an array of separate die modules of smaller area. The separate die modules are assembled into an array of cavities formed in a carrier substrate and interconnected to achieve a combined functionality equivalent to the functionality of the conceptual large area die. The die modules are fabricated with higher yields than if the large area die is fabricated, due to the smaller area of the individual die modules.

In an aspect, a method of assembly is disclosed that includes assembling a plurality of singulated first die into a plurality of cavities formed on a first side of a carrier substrate such that a front side of the first die is exposed and a back side of the first die faces a bottom surface of the cavity, wherein the carrier substrate further comprises a second side opposite the first side; backlapping the second side of the carrier substrate to reduce a thickness of the carrier substrate, thereby forming a thinned carrier substrate; fabricating a second substrate having an active circuit first side and a second side opposite the active circuit first side; stacking the second substrate and the thinned carrier substrate such that the backlapped second side of the thinned carrier substrate is coupled to the active circuit first side of the second substrate; and forming a plurality of through vias thereby forming conductive interconnects between the front side of each of the plurality of first die assembled in the thinned carrier substrate and the active circuit first side of the second substrate. Backlapping the second side of the carrier substrate can include backlapping the carrier substrate at least past the bottom surface of the plurality of cavities, thereby backlapping a portion of the back side of the first die assembled in each cavity. Backlapping the second side of the carrier substrate can include backlapping the carrier substrate up to and including the bottom surface of the plurality of cavities while leaving the first die assembled in each cavity intact. The method can also include forming one or more interconnect layers on the front side of the plurality of first die and the first side of the carrier substrate, thereby forming conductive interconnects coupled to the plurality of first die and to the plurality of through-vias. The method can also include forming one or more interconnect layers on the active circuit first side of the second substrate, thereby forming conductive interconnects coupled to the active circuit first side, further wherein the plurality of through-vias are coupled to the conductive interconnects coupled to the active first side. The thinned carrier substrate can be coupled to the second substrate using an adhesive layer, in which case the plurality of through-vias are formed through the adhesive layer. In some embodiments, the active circuit first side of the second substrate includes a plurality of second die fabricated therein.

Alternatively, the second substrate includes a second carrier substrate and fabricating the second carrier substrate includes assembling a plurality of singulated second die into a plurality of cavities formed on a first side of the second carrier substrate such that a front side of the second die is exposed and a back side of the second die faces a bottom surface of the cavity, wherein the second carrier substrate further comprises a second side opposite the first side; and backlapping the second side of the second carrier substrate to reduce a thickness of the second carrier substrate, thereby forming a thinned second carrier substrate. In this alternative embodiment, backlapping the second side of the carrier substrate can include backlapping the carrier substrate at least past the bottom surface of the plurality of cavities, thereby backlapping a portion of the back side of the first die assembled in each cavity. Alternatively, backlapping the second side of the carrier substrate can include backlapping the carrier substrate up to and including the bottom surface of the plurality of cavities while leaving the first die assembled in each cavity intact. The method can also include forming one or more interconnect layers on the first side of the thinned second carrier substrate, thereby forming conductive interconnects coupled to the front side of the plurality of second die, further wherein the plurality of through-vias are coupled to the conductive interconnects coupled to the front side of the plurality of second die. One or more of the plurality of through-vias can be formed through the thinned carrier substrate. Alternatively, one or more of the plurality of through-vias can be formed through the first die assembled in the cavity. In some methods, the plurality of through-vias are formed by forming vias from the first side of the carrier substrate partially through the carrier substrate, and backlapping the second side of the carrier substrate until at least exposing the vias.

In another aspect, a composite structure is disclosed including a thinned carrier substrate including a first side with a plurality of cavities formed therein and a plurality of singulated first die assembled into the plurality of cavities such that an active circuit front side of the first die is exposed at the first side, wherein the thinned carrier substrate includes a second side opposite the first side, the second side is backlapped; a second substrate having an active circuit first side and a second side opposite the active circuit first side, wherein the second substrate is coupled to the thinned carrier substrate such that the backlapped second side of the thinned carrier substrate faces the active circuit first side of the second substrate; and a plurality of through-vias forming conductive interconnects between the active circuit front side of each of the plurality of first die assembled in the thinned carrier substrate and the active circuit first side of the second substrate. The second side of the thinned carrier substrate can be backlapped to a thickness such that a bottom surface of each cavity is removed and a portion of a back side of the first die is also backlapped. Alternatively, the second side of the thinned carrier substrate can be backlapped to a thickness such that a bottom surface of each cavity is removed and the first die remains fully intact. One or more of the plurality of through-vias can be formed through the thinned carrier substrate. Alternatively, one or more of the plurality of through-vias can be formed through the first die assembled in the cavity. The composite structure can also include one or more first interconnect layers formed on the front side of the plurality of first die and the first side of the thinned carrier substrate, wherein the one or more first interconnect layers include first conductive interconnects coupled to the plurality of first die and to the plurality of through-vias. The composite structure can also include one or more second interconnect layers formed on the active circuit first side of the second substrate, wherein the one or more second interconnect layers include second conductive interconnects coupled to the active circuit first side of the second substrate, further wherein the plurality of through-vias are coupled to the second conductive interconnects. The composite structure can also include an adhesive layer to couple the thinned carrier substrate to the second substrate, in which case the plurality of through-vias are formed through the adhesive layer. In some embodiments, the active circuit first side of the second substrate comprises a plurality of second die fabricated therein.

Alternatively, the second substrate is a thinned second carrier substrate including a first side with a plurality of cavities formed therein and a plurality of singulated second die assembled into the plurality of cavities such that an active circuit front side of the second die is exposed at the first side of the thinned second carrier substrate, wherein the thinned second carrier substrate includes a second side opposite the first side, the second side is backlapped to remove a bottom surface of the plurality of cavities and expose a back side of the second die at the backlapped second side of the second thinned carrier substrate. In this alternative embodiment, the plurality of first die can be fabricated using a different technology than the plurality of second die. In some embodiments, the thinned second carrier substrate also includes another plurality of cavities formed on the first side and a plurality of singulated third die assembled into the other plurality of cavities such that an active circuit front side of the third die is exposed at the first side of the thinned second carrier substrate. The plurality of third die can be fabricated using a different technology than the plurality of second die.

In yet another aspect, a method of assembly includes fabricating a carrier substrate including a plurality of sloped cavities formed on a first side of the carrier substrate, wherein each of the cavities is characterized by a cavity shape and a cavity depth; fabricating a plurality of singulated first die, wherein each of the plurality of first die include a die shape that is substantially the same as the cavity shape and a die size that is smaller than a cavity size including a die thickness that is less than the cavity depth; and assembling one of the plurality of first die into each of the plurality of cavities in the carrier substrate, wherein the die shape and the die size of the first die and the cavity shape and the cavity depth of the sloped cavity enable the first die to rest within the cavity while a bottom surface of the first die is suspended over a bottom surface of the cavity, thereby forming a gap below the first die between the bottom surface of the first die and the bottom surface of the cavity. The method can also include adding a low-stress material to the bottom surface of each cavity before assembling one of the plurality of first die into each of the plurality of cavities such that the gap below the first die is filled with the low-stress material after assembling one of the plurality of first die into each of the plurality of cavities. In some embodiments, a top surface of the first die is substantially co-planar with the top surface of the carrier substrate when the first die is at rest within the cavity. In other embodiments, an active circuit front side of the first die is below the top surface of the carrier substrate when the first die is at rest within the cavity thereby forming a gap above the first die between the an active circuit front side of the first die and a plane of the first side of the carrier substrate. In this case, the method can also include adding a low-stress material to the an active circuit front side of each first die at rest within the cavity such that the gap above the first die is filled with the low-stress material. The method can also include filling the gap below the first die with the low-stress material while leaving the gap above the first die empty. The method can also include adding a cap structure above each of the plurality of cavities. In some embodiments, the first die is a micro-electro-mechanical system (MEMS) device and a movable element of the MEMS device moves within the gap above the MEMS device, the gap below the MEMS device, or both the gaps above and below the MEMS device. The cap structure can be sealed to the carrier substrate thereby forming a sealed environment within each cavity. The method can also include forming one or more interconnect layers on at least one side surface of the cavity and the first side of the carrier substrate, wherein the one or more interconnect layers are coupled to the MEMS device. The method can also include applying an adhesive to side surfaces of the cavity to hold the first die in place within the cavity. The method can also include forming one or more interconnect layers on an active circuit front side of the plurality of first die and the first side of the carrier substrate, thereby forming conductive interconnects coupled to the plurality of first die.

In still yet another aspect, an assembly includes a carrier substrate including a plurality of sloped cavities formed on a first side of the carrier substrate, wherein each of the cavities is characterized by a cavity shape and a cavity depth; and a plurality of singulated first die, wherein each of the plurality of first die include a die shape that is substantially the same as the cavity shape and a die size that is smaller than a cavity size including a die thickness that is less than the cavity depth, one of the plurality of first die is positioned in each of the plurality of cavities in the carrier substrate, wherein the die shape and the die size of the first die and the cavity shape and the cavity depth of the sloped cavity enable the first die to rest within the cavity while a bottom surface of the first die is suspended over a bottom surface of the cavity, thereby forming a gap below the first die between the bottom surface of the first die and the bottom surface of the cavity. The gap below the first die can be filled with a low-stress material. In some embodiments, an active circuit front side of the first die is substantially co-planar with the first side of the carrier substrate when the first die is at rest within the cavity. In other embodiments, an active circuit front side of the first die is below the first side of the carrier substrate when the first die is at rest within the cavity thereby forming a gap above the first die between the an active circuit front side of the first die and a plane of the first side of the carrier substrate. In this alternative embodiment, the gap above the first die can be filled with a low-stress material or left as open space. In some embodiments, the gap below the first die is filled with the low-stress material while the gap above the first die is empty. The assembly can also include a cap structure positioned above each of the plurality of cavities. In some embodiments, the first die is a micro-electro-mechanical system (MEMS) device and a movable element of the MEMS device moves within the gap above the MEMS device, the gap below the MEMS device, or both the gaps above and below the MEMS device. The cap structure can be sealed to the carrier substrate thereby forming a sealed environment within each cavity. The assembly can also include one or more interconnect layers formed on at least one side surface of the cavity and the first side of the carrier substrate, wherein the one or more interconnect layers are coupled to the MEMS device. The assembly can also include an adhesive applied to side surfaces of the cavity to hold the first die in place within the cavity. The assembly can also include one or more interconnect layers formed on an active circuit front side of the plurality of first die and the first side of the carrier substrate, thereby forming conductive interconnects coupled to the plurality of first die.

In another aspect, a method of assembly includes designing a conceptual large area die as an array of separate die modules, each die module designed as a single small area die wherein each die module includes a surface area that is smaller than a surface area of the conceptual large area die; fabricating each die module in the array, wherein each die module is fabricated on a separate substrate and singulated; fabricating a carrier substrate including an array of cavities formed on a first side of the carrier substrate, wherein each cavity in the array of cavities corresponds to one die module in the array of separate die modules; assembling a specific one die module into a predetermined one cavity of the array of cavities such that all die modules in the array of separate die modules are assembled into the array of cavities thereby forming an array of assembled die modules; and interconnecting the array of assembled die modules thereby forming a functional large are die having a same functionality as the conceptual large area die. In some embodiments, each die module is fabricated using a same technology. In other embodiments, one or more of the die modules are fabricated using different technologies. In some embodiments, each die module in the array of separate die modules has a different functionality. Each die module can be fabricated in a batch process such that a plurality of the same die modules are fabricated from the separate substrate. In some embodiments, the array of assembled die modules are interconnected by forming conductive interconnects, wherein the conductive interconnects have a line geometry that is greater than a line geometry of active circuitry of the die modules. The method of assembly is a yield improvement process whereby a yield of good die for each of the die modules is greater than a yield for the single large area die. In some embodiments, one of more of the die modules include a graphene layer. In some embodiments, each cavity and corresponding die module have a same shape as each other cavity and corresponding die module. In some embodiments, each cavity and corresponding die module have a same size as each other cavity and corresponding die module. In other embodiments, one or more cavities and corresponding die modules have a different shape as the remaining cavities and corresponding die modules. In some embodiments, one or more cavities and corresponding die modules have a different size as the remaining cavities and corresponding die modules. The method can also include assembling additional elements between the die modules in the array of assembled die modules.

In yet another aspect, an assembly includes an array of separate die modules, each die module has a different functionality; a carrier substrate including an array of cavities formed on a first side of the carrier substrate, wherein each cavity in the array of cavities corresponds to one die module in the array of separate die modules such that a specific one die module from the array of separate die modules is assembled into a corresponding one cavity of the array of cavities, thereby forming an array of assembled die modules; and conductive interconnects coupled to the array of assembled die modules, wherein the conductive interconnects provide interconnectivity between the array of assembled die modules thereby forming a functional large area die. In some embodiments, each die module is fabricated using a same technology. In other embodiments, one or more of the die modules are fabricated using different technologies. Each die module can be fabricated in a batch process such that a plurality of the same die modules are fabricated from the separate substrate. In some embodiments, the conductive interconnects have a line geometry that is greater than a line geometry of active circuitry of the die modules. In some embodiments, one of more of the die modules include a graphene layer. In some embodiments, each cavity and corresponding die module have a same shape as each other cavity and corresponding die module. In some embodiments, each cavity and corresponding die module have a same size as each other cavity and corresponding die module. In other embodiments, one or more cavities and corresponding die modules have a different shape as the remaining cavities and corresponding die modules. In some embodiments, one or more cavities and corresponding die modules have a different size as the remaining cavities and corresponding die modules. The assembly can also include additional elements positioned between the die modules in the array of assembled die modules.

DETAILED DESCRIPTION OF THE EMBODIMENTS

Figure 1:
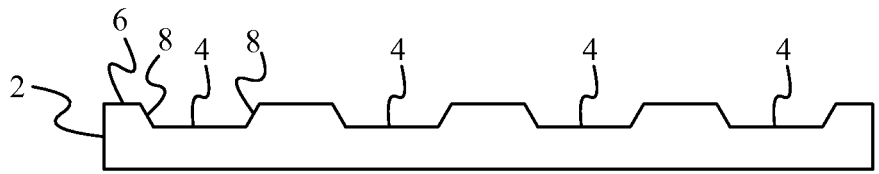
FIG. 1 illustrates a cut-out side view of a substrate having a plurality of cavities formed in a top surface of the substrate.
Figure 2:
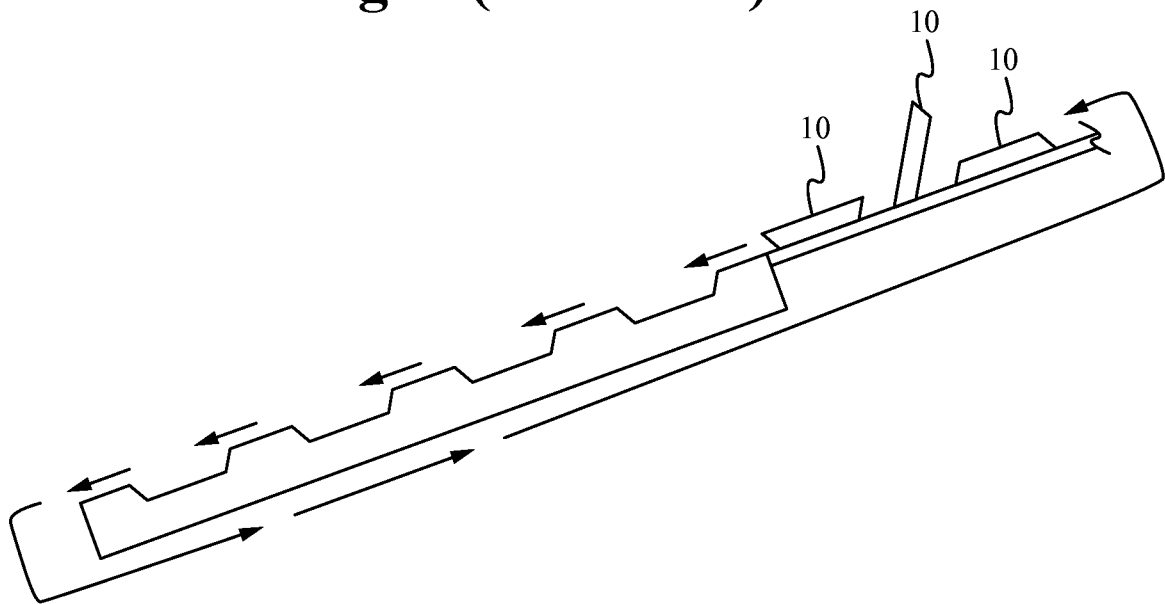
FIG. 2 illustrates the substrate of FIG. 1 subjected to the fluidic self-assembly process.
Figure 3:
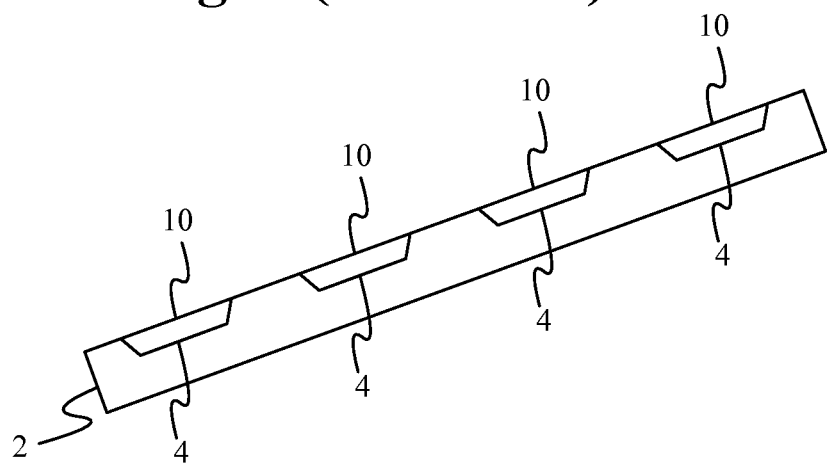
FIG. 3 illustrates the substrate of FIGS. 1 and 2 after the fluidic self-assembly process is completed.

Embodiments of the present application are directed to a heterogeneous assembly and process. Those of ordinary skill in the art will realize that the following detailed description of the heterogeneous assembly and process is illustrative only and is not intended to be in any way limiting. Other embodiments of the assembly process will readily suggest themselves to such skilled persons having the benefit of this disclosure.

Reference will now be made in detail to implementations of the heterogeneous assembly and process as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions will likely be made in order to achieve the developer's specific goals, such as compliance with application and business related constraints, and that these specific goals can vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

An assembly process is used to properly position and align a plurality of first die with a carrier substrate. The first die are fabricated according to a first technology. The carrier substrate is then aligned with a second substrate having a plurality of second die fabricated therein. In some embodiments, the second substrate, and therefore the plurality of second die, are fabricated according to a second technology different than the first technology. The plurality of first die are positioned within cavities formed in the first interface surface of the carrier substrate. The cavities in the first interface surface of the carrier are preferably profiled to accept the die in only a single orientation. The interfacing surfaces of the carrier substrate and the second substrate include active circuitry of the first die and the second die. The carrier substrate is aligned to the second substrate. This step also aligns each of the plurality of first die with the plurality of second die. One or more first die can be aligned with each second die. Once aligned, a wafer bonding process is performed to bond the first die to the second die. Metal interconnects between the active circuitry of the first die and the second die are formed during the wafer bonding process. In some embodiments, once the wafer bonding process is completed, the carrier substrate is removed, leaving behind the plurality of first die bonded to the plurality of second die of the second substrate. A passivation layer or a planarization layer can be added over the plurality of first die and second substrate. In other embodiments, the carrier substrate is left in place to form a cap. The second substrate is then cut to singulate each of the plurality of second die. Each singulated second die and the one or more first die bonded to the second die form a die stack.

In general, it is an objective of the assembly process to couple a first substrate having a first form factor and a second substrate having a second form factor different than the first form factor using assembly and wafer bonding technologies. It is also an objective of the assembly process to couple multiple die having disparate die types, for example different die fabrication technologies, different die shapes, and/or different die sizes. The first substrate is used to fabricate the plurality of first die. The plurality of first die are singulated and then self-assembled into the carrier substrate. The carrier substrate has the same form factor as the second substrate. The plurality of second die are fabricated on the second substrate. In some embodiments, the carrier substrate is used as an intermediary, where the plurality of first die can be fabricated using a first technology, such as GaAs (Galium Arsenide) technology, having a first form factor, such as a 6 inch diameter wafer, and then assembled onto the carrier substrate have a second form factor, such as an 8 inch diameter substrate. The wafer bonding process is then performed on the carrier substrate having the second form factor and the second substrate also having the second form factor, for example an 8 inch diameter wafer, where the plurality of second die can be fabricated on the second substrate using a second technology, such as CMOS (complimentary metal-oxide-semiconductor) technology. In this manner, die fabricated using different types of technology and different form factors can be assembled together. In this case, the first form factor is different than the second form factor. In other embodiments, the first form factor is the same as the second form factor. For example, the diameter of the first substrate is the same as the diameter of the second substrate. Such assembly is achieved at the packaging stage, not at the wafer fabrication stage. These die are also assembled with high density interconnects.

In this embodiment, the assembly process uses the carrier substrate as an intermediate mechanism for temporarily holding the plurality of first die in a desired position and orientation for mating with the second substrate having a plurality of second die. In some embodiments, the carrier substrate is an intermediate mechanism for temporarily holding the plurality of first die. In other embodiments, the carrier substrate is retained as part of the finished package. An assembly step is used to position the plurality of first die on the carrier substrate. In some embodiments, a shape-based fluidic self-assembly process is used. In other embodiments, non-fluidic self-assembly processes can be used. For example, the shape-based fluidic self-assembly technique can be adapted so that the singulated first die are coated with a magnetic material, such as a thin layer of iron, on the surface that is to be at the bottom of the cavity, for example the "back" side of the singulated first die. The magnetic material is magnetized in a certain direction so that when a magnetic field is applied, the die orient themselves properly. A magnet is then used to move the singulated first die across the top surface of the carrier substrate, similarly to the fluid carrying singulated die. The magnet can be positioned above or below the carrier substrate, and the magnet moves until all cavities within the carrier substrate are filled with singulated first die. Moving the magnet is optional, especially if this is combined with fluidic self-assembly. Alternatively, each singulated first die has a magnetic coating that is magnetized in a particular direction, and a magnetic field is applied during the fluidic self-assembly process to ensure proper orientation of the first die relative to the cavities. Another self-assembly technique that does not use fluid is an agitation technique where singulated first die are positioned on the top surface of the carrier substrate and the carrier substrate is agitated, such as by an ultrasonic transducer, thereby agitating the singulated first die into the cavities.

Figure 15:
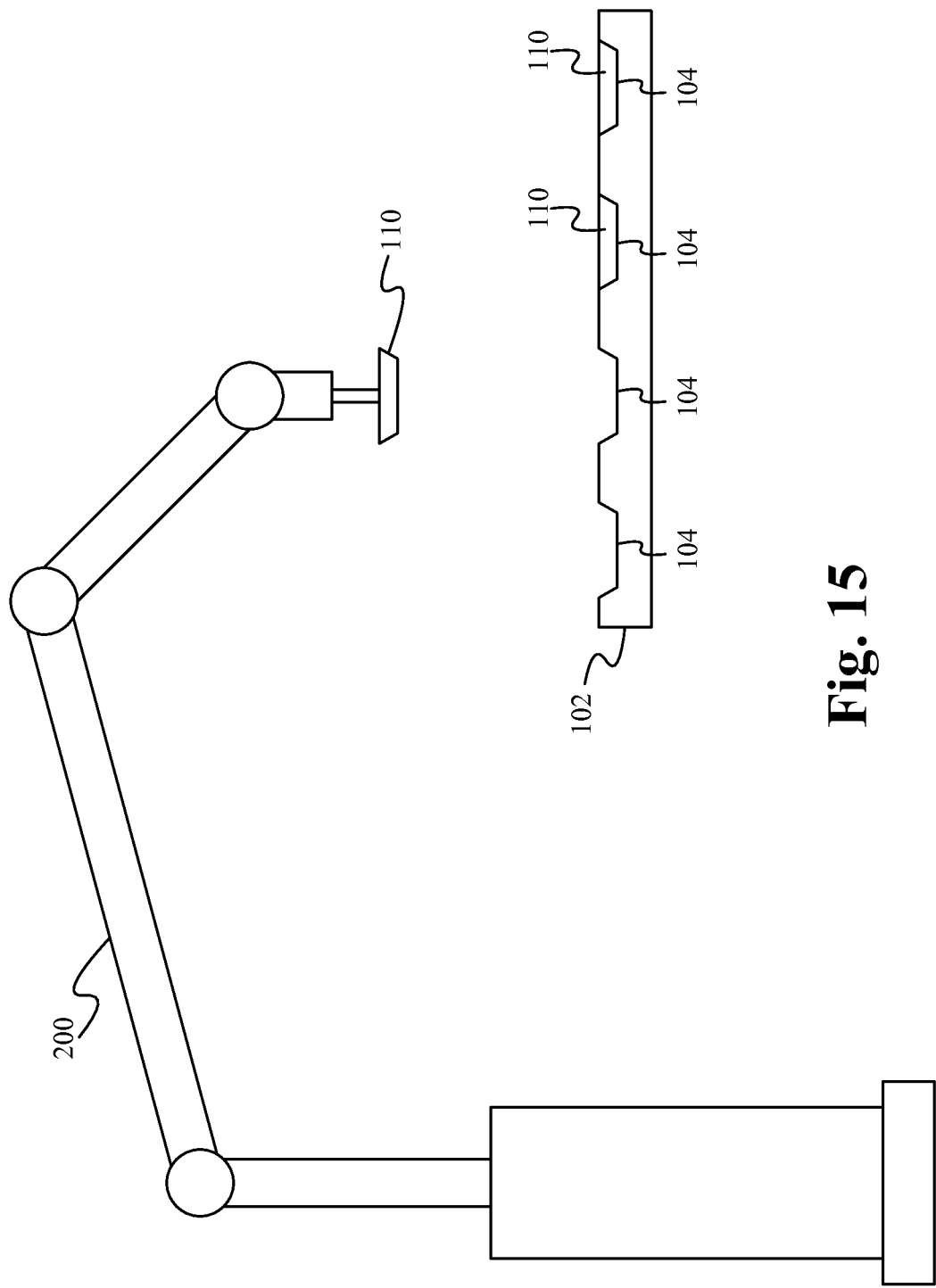
FIG. 15 illustrates an assembly process of a carrier substrate using a pick and place technique.

In some embodiments, a self-aligning pick and place technique is used to position the plurality of first die within the cavities of the carrier substrate. FIG. 15 illustrates an assembly process of a carrier substrate using a pick and place technique. A carrier substrate 102 includes a plurality of cavities 104. A first die 110 is positioned within each of the cavities 104 using a pick and place machine 200. Using a shape based technique associated with a size and shape of the cavities 104 in the carrier substrate 102, the pick and place machine 200 places a first die over the cavity. Dropping the first die into the cavity allows the first die to self-align accurately within the cavity due to the shape of the cavity. In some embodiments, the cavity has inwardly sloping sides. The first die is positioned close enough to the cavity to enable the first die to properly enter the cavity. The sloped edges of the cavity direct the first die properly into place. The positional accuracy of the pick and place machine is reduced compared to conventional techniques since the first die does not have to be exactly aligned and positioned by the pick and place machine. Reducing the positional accuracy required by the pick and place machine also increases the assembly speed of filling all the cavities in the carrier substrate. In general, the pick and place machine does not have to be as accurate or take as much time placing each first die as conventional pick and place techniques. In some embodiments, a pick and place machine inserts the first die in the cavity by using air pressure, such as suction and/or puffs of air.

Figure 4:
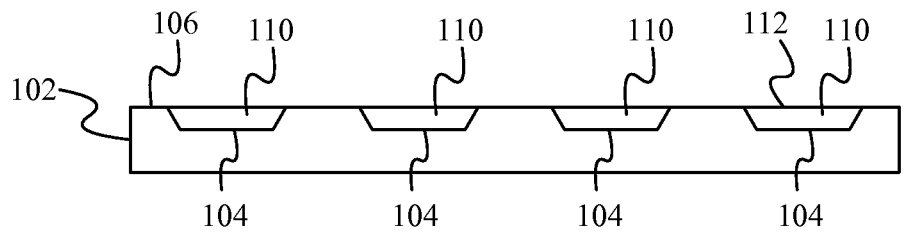
FIG. 4 illustrates a cut out side view of an exemplary carrier substrate after a self-assembly process is performed.

FIG. 4 illustrates a cut out side view of an exemplary carrier substrate after an assembly step is performed. The carrier substrate 102 includes a plurality of cavities 104. A first die 110 is positioned within each of the cavities 104. In this exemplary configuration, each of the cavities 104 is shaped the same, and each of the first die 110 are shaped the same and are of the same type, for example all of the first die 110 are fabricated using a first technology. In this exemplary configuration, a top surface 112 of each first die 110 is substantially co-planar with a top surface 106 of the carrier substrate when the first die 110 is positioned within the cavity 104. In other configurations, the cavities and the first die are configured such that the top surface of the first die extends above or below the top surface of the carrier substrate. In an exemplary application, the plurality of first die are made from GaAs fabricated on a six inch diameter wafer, and the carrier substrate has an eight inch diameter.

To determine if all cavities within the carrier substrate have been filled with first die, an inspection is periodically performed. In some embodiments, the inspection is an optical inspection. The inspection can be manual or automated. If it is determined that one or more cavities remain empty, then the assembly step is continued. If it is determined that all cavities are filled, then the assembly step is stopped.

There are different mechanisms that maintain the first die in place within the cavities of the carrier substrate. One mechanism is the force between the die and the sidewalls of the cavity, referred to as a Van Der Waals force, which is intrinsic to all materials. In addition to the sidewalls, the bottom of the cavity can also provide an attractive Van Der Waals force. Another mechanism can be to apply an adhesive, such as a weak adhesive, within the cavity so that when the first die falls into the cavity during assembly, the adhesive maintains the first die within the cavity. It is understood that other conventional mechanisms can be used to maintain the first die within the cavity. In some embodiments, the mechanism used to retain the first die within the cavity must be able to be overcome during a subsequent processing step so as to enable removal of the first die from the cavity.

Using the assembly process, the first die fabricated on a first substrate having a first form factor, such as six inches in diameter, are transferred to the carrier substrate having a second form factor, such as eight inches in diameter, which is different than the first form factor. Alternatively, the first form factor can be the same as the second form factor. The form factor of the carrier substrate is the same as a form factor of a second substrate to which the first die are to be subsequently bonded.

Figure 5:
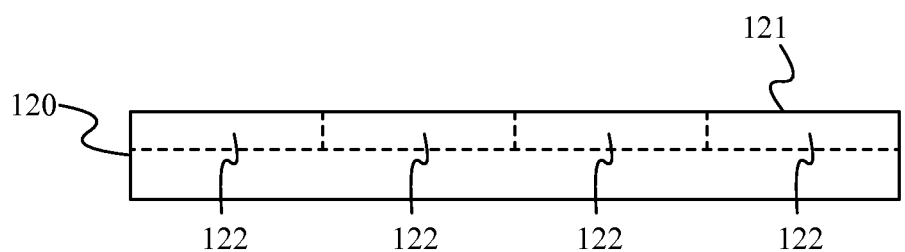
FIG. 5 illustrates a cut out side view of an exemplary second substrate after a plurality of second die are fabricated.

The second substrate is fabricated to have a plurality of second die, which in some embodiments are larger in size than the first die fabricated on the first substrate. FIG. 5 illustrates a cut out side view of an exemplary second substrate 120 after a plurality of second die 122 are fabricated. The second die are fabricated using a second technology, such as CMOS, which is different than the first technology used to fabricate the first die. Also, the size of the second die is larger than the size of the first die. For example, a GaAs first die is 50 mils a side, and a CMOS second die is 200 mils a side.

Figure 6:
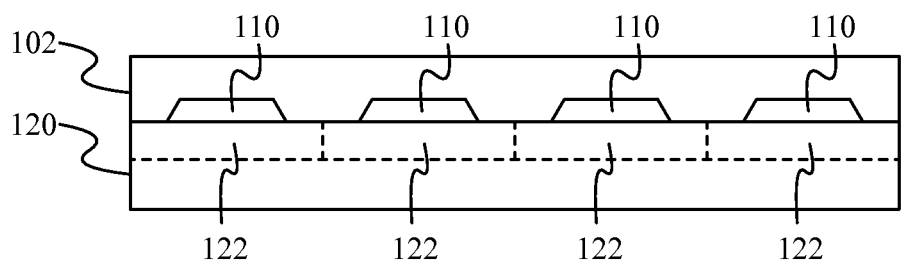
FIG. 6 illustrates the alignment of the carrier substrate of FIG. 4 on top of the second substrate of FIG. 5.

The carrier substrate including the assembled first die and the second substrate including the fabricated second die are then aligned. In some embodiments, the second substrate 120 is positioned with the surface 121 facing upward, and therefore with the exposed surface of each second die 122 facing upward. The carrier substrate 102 is turned upside down so that the surface 106 is turned downward, facing the surface 121 of the second substrate. The retention mechanism is sufficient to maintain the first die within the cavities of the carrier substrate in the upside down configuration. FIG. 6 illustrates the alignment of the carrier substrate 102 of FIG. 4 on top of the second substrate 120 of FIG. 5. In other embodiments, the carrier substrate 102 is positioned with the surface 106 facing upward, and therefore with the exposed surface 112 of each first die 110 facing upward. In this case, the second substrate 120 is turned upside down so that the surface 121 is turned downward, facing the surface 106 of the carrier substrate 102. Under these circumstances, gravity also aids in maintaining the die 110 in the carrier substrate 102.

In some embodiments, the carrier substrate including the assembled first die and the second substrate including the second die are aligned for bonding by an optical alignment device, such as an infrared camera, that "looks" through the two substrates to properly align the two to each other. Such optical alignment devices and processes are well known in the art.

Once aligned, the surface 112 of each first die 110 is facing the surface 121 of the second substrate 120, and therefore facing the surface of each second die 122. Since the carrier substrate and the second substrate each have the same form factor, aligning the two substrates is simply a matter of aligning the perimeters of the two substrates. In some embodiments, the cavities in the carrier substrate are positioned such that one assembled first die is aligned with one of the second die on the second substrate. Other configurations are also contemplated, and are discussed in detail below.

A wafer bonding process is then performed between the carrier substrate including the assembled first die and the second substrate including the fabricated second die. The wafer bonding process results in dense interconnects between each bonded first die and second die. It is understood that conventional wafer bonding techniques account for the various specifics related to formation of the interconnects, for example the specific chemistries that are used, and the necessary heights and clearances used. The details of theses techniques are application specific, and therefore vary depending on the types and characteristics of the die to be bonded. The wafer bonding process is performed in part by pressing the two substrates together and applying heat, ultrasonic bonding or other techniques. In some embodiments, on the second substrate, in spaces between the second die, there may be bumps that prevent the spaces on the second substrate from bonding with the corresponding surface on the carrier substrate. In some embodiments, an adhesive coating can be applied between the two wafers in a manner that does not interfere with the metal connections. This ensures that only the interface surfaces of the first die and the second die are bonded, while the remaining surfaces are not bonded. In other embodiments, the exposed surface of the first die and the top surface of the carrier substrate are not planar, with the first die extending slightly above the top surface of the carrier substrate. This configuration provides a gap between the top surface of the carrier substrate and the top surface of the second substrate when the first die in the carrier substrate are in contact with the second die in the second substrate.

Figure 7:
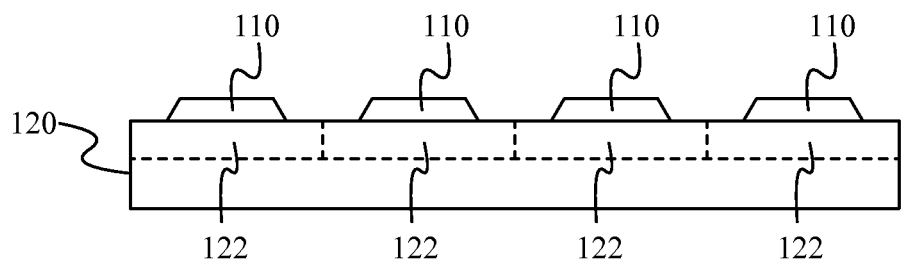
FIG. 7 illustrates the assembly of FIG. 6 after the wafer bonding process has been performed and the carrier substrate has been removed.

In some embodiments, any force keeping the first die within the cavities of the carrier substrate is less than the bonding force between the first die and the second die. As such, the carrier substrate can be removed, leaving behind the first die bonded to the second die of the second substrate. FIG. 7 illustrates the assembly of FIG. 6 after the wafer bonding process has been performed and the carrier substrate has been removed. In some embodiments, each first die has a metalized back surface. In other embodiments, the back surface has an oxide layer. In some embodiments, where an adhesive is used to hold the first die within the cavities of the carrier substrate, a solvent can be applied prior to removing the carrier substrate, thereby weakening the adhesive and allowing the carrier substrate to be removed. The second substrate is then cut to singulate each second die and the corresponding first die bonded to the singulated second die, thereby forming a plurality of singulated die stacks. In some embodiments, prior to singulating the die stacks, a passivation layer or a planarization layer is formed over the front side surface of the second substrate and the plurality of first die bonded to the front side surface, such as the layer 140 in FIG. 10. A top surface of this layer can be metalized. In other embodiments, the plurality of first die bonded to the second substrate are left exposed, and the exposed back surface of the first die can be metalized.

The resulting singulated die stacks have a first die made of a first material/technology bonded to a second die made of a second material/technology that is different than the first material/technology. Further, there is a high density of interconnects between the bonded first die and second die. With a high density of interconnects comes low parasitics. The performance of the overall device is limited by the parasitics. Lower parasitics is particularly useful, for example, in the mating of CMOS devices and bipolar, GaAs, or GaN devices, which are high speed devices. Conventional side by side or stacked die techniques are more limited by the parasitics than the devices assembled using the assembly process. Additionally, the assembly process enables the mating of different substrate/wafer sizes. Connecting die from different wafer sizes enables a less expensive wafer type, such as a second wafer made of silicon, to continue to increase in size, such as 12 inch diameters, while keeping more expensive wafer types, such as GaAs or GaN, to smaller sizes, such as 6 or 8 inch diameters.

Before performing the assembly step, the plurality of first die are tested so that only properly functioning first die are assembled onto the carrier substrate. However, the second die still part of the uncut second substrate are subject to yield constraints. This is a disadvantage of using the conventional wafer bonding technique when bonding the plurality of first die of the carrier substrate to the plurality of second die on the second substrate. In conventional wafer bonding, neither the die on the first wafer nor the die on the second wafer are tested, and therefore suffer from a cumulative defect density of both wafers being bonded. In contrast, the assembly process does not suffer from a cumulative defect density because the first die are singulated and pre-tested before the assembly step and the subsequent wafer bonding step. Using the above described assembly process, only the second substrate contributes to the defect density of the resulting die stack. Therefore, the assembly process reduces the defect density of die stacks compared to the conventional wafer bonding process.

The assembly process can be expanded to provide additional connectivity. In some embodiments, a size of the second die is greater than a size of the first die. In this case, the first die only covers a portion of the second die when bonded together. For example, the first die measures 50 mils a side, and the second die measures 200 mils a side. In this exemplary case, the assembly process enables mating of the first die and the second die without the first die having to be 200 mils a side. The assembly process provides a translation of a plurality of first die onto a plurality of second die with gaps in between the bonded positions of each first die. These gaps can be used as bonding sites for other die. Prior to cutting the second substrate and singulating the second die, the remaining uncovered surface area of the second die can be used to be bonded to one or more other die depending on the size of the uncovered surface area and the interface surface area(s) of the other die. The other die can be one or more additional first die, such that multiple first die are bonded to a single second die, and/or the other die can be a third, fourth, fifth, etc. die each fabricated using a different technology than the first die or the second die, for example a third technology, a fourth technology, a fifth technology, etc. The number of other die bonded to the second die is limited only by the surface area of the second die and the surface area of the other die.

Figure 8:
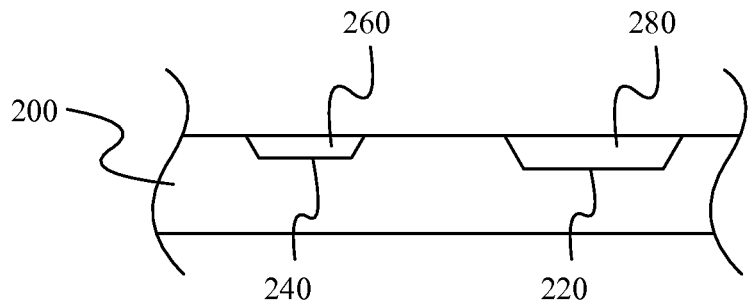
FIG. 8 illustrates a cut out side view of a portion of an exemplary mixed die type carrier substrate configured with different shaped and/or sized cavities that accommodate different types of die.

The assembly step can be adapted to accommodate bonding of multiple die to a single second die. In some embodiments, the carrier substrate is configured with a cavity pattern that has two, or more, cavities aligned with each second die on the second substrate. The cavity sizes, shapes, and positions can be configured to accommodate the desired positions and types of die to be bonded to the second die. For example, where two first die are to be bonded to a single second die, the cavity pattern is configured with two cavities per second die and each of the two cavities is configured to accommodate a first die. Where a first die and a third die are to be bonded to a single second die, the cavity pattern is configured with two cavities per second die and one of the two cavities is configured to accommodate a first die and the other of the two cavities is configured to accommodate a third die. In this embodiment, a single carrier substrate is used where the carrier substrate has cavities configured for different die types, the cavities for each die type being shaped differently. FIG. 8 illustrates a cut out side view of a portion of an exemplary mixed die type carrier substrate 200 configured with different shaped and/or sized cavities 220 and 240 that accommodate different types of die 260 and 280, respectively. The portion of the carrier substrate 200 shown in FIG. 8 corresponds to a single second die on the second substrate.

In some embodiments, each different die type can be serially assembled using the fluidic self-assembly process, first one die type is self-assembled into the proper cavities in the mixed-type carrier substrate, then a second die type, and so on. In this case, the die type with the largest corresponding cavity is self-assembled first so as to prevent die types with correspondingly smaller cavities from improperly falling into the larger cavities intended for other die types. Alternatively, the self-assembly process can be simultaneously performed using multiple different die types mixed within a single fluid mixture that flows over the mixed-type carrier substrate. Using this approach, the size and shape of the different die types and the corresponding cavities in the mixed-type carrier substrate must be configured to prohibit die of different types from fitting into the wrong cavities. It is understood that alternative approaches are also contemplated for assembling multiple different die types within a single mixed-type carrier substrate, such as the self-aligning pick and place technique described above.

In other embodiments, multiple different carrier substrates are used. A first carrier substrate, such as the carrier substrate 102, is used as described above to assemble the plurality of first die within the first carrier substrate, and then to bond the first die to second die on the second substrate. Another assembly step is then performed using a second carrier substrate configured with cavities to be filled with the third die. The pattern of the cavities on this second carrier substrate are aligned with the uncovered portions of the second die on the second wafer. In this case, the second carrier substrate is also configured with a plurality of first die cavities arranged in a pattern that matches the pattern of the plurality of first die bonded to the second wafer. Each of the first die cavities has a size and shape that enables the first die bonded on the second substrate to fit within the first die cavity when the second carrier substrate is bonded to the second substrate. This enables the plurality of third die assembled on the second carrier substrate to contact the uncovered portions of the plurality of second die on the second substrate. Additional carrier substrates can be used to similarly assemble and bond other die types to the second substrate. In general, the assembly process can use one or more variously configured carrier substrates to bond one or multiple die of the same type or multiple die of different die types to each second die on the second substrate.

Figure 9:
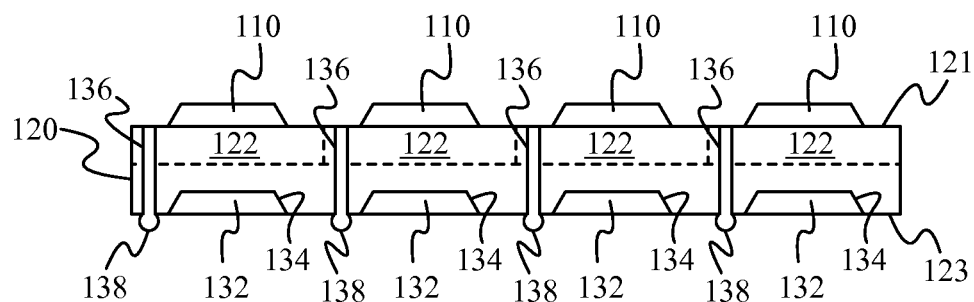
FIG. 9 illustrates a cut out side view of the bonded stack of FIG. 7 where additional die are assembled on the opposite side of the second substrate as the second die and bonded first die.

The assembly process can be further expanded to provide additional connectivity. A plurality of second cavities can be formed on the opposite side of the second substrate as the plurality of second die. The plurality of second cavities are formed as a separate processing step before, during, or after the fabrication of the plurality of second die. Another assembly step can be performed whereby die can be assembled within the second cavities. This assembly step can be performed before or after the first die are bonded to the second die. The die assembled into the second cavities can be of the same or different technologies than the first die and/or the second die. The second cavities are configured according to the desired die geometry. FIG. 9 illustrates a cut out side view of the bonded stack of FIG. 7 where additional die 132 are assembled on the opposite side of the second substrate as the second die 122 and bonded first die 110. A plurality of second cavities 134 are formed into the back side surface 123 of the second substrate 120. The die 132 are assembled into the second cavities 134 in a similar manner as the first die 110 are assembled into the carrier substrate 102 (FIG. 4).

Furthermore, through-silicon vias (TSVs) 136 can be formed within the second substrate 120 to provide connections between devices on a first side surface 121 of the second substrate 120, such as the second die 122 or the bonded first die 110, and devices on the opposite side surface 123 of the second substrate 120, such as the die 132 assembled in the second cavities 134. The TSVs can also be electrically coupled to any other interconnects on either the surface 121 or the surface 123 of the second substrate 120. Metal interconnects can be formed on the surface 121 to couple the TSV 136 to the second die 122 and/or the first die 110. Similarly, metal interconnects can be formed on the surface 123 to couple the TSV 136 to the second die 132. The TSVs serve both as electrical interconnects and as thermal conduction mechanisms for transferring heat from the second die 122 and/or the first die 110 to a printed circuit board, via the solder balls 138.

Although each first die 110 on the front-side surface 121 is shown to be aligned with one of the die 132 on the back side surface 123, this is merely an exemplary configuration. The pattern and sizes of the plurality of first die 110, the pattern and sizes of the plurality of die 132, and their positional relationship to each other can be varied based on application.

In some embodiments, solder balls are attached at the end points of the TSVs, for example solder ball 138 in FIG. 9. The solder balls can be used to couple the die stack to a printed circuit board or to a test device. Alternatively, the solder balls are coupled to the end points of the TSVs via metal interconnects on surface 123. In other embodiments, the surface 123 includes a metalization pattern that can be bonded out using conventional techniques.

Figure 10:
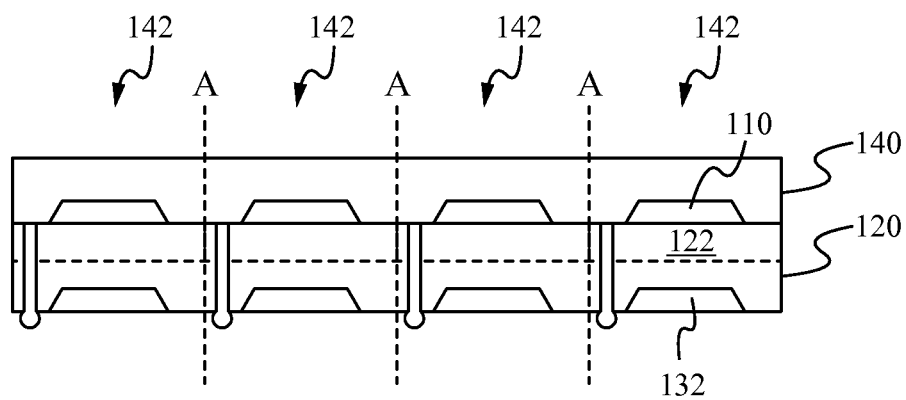
FIG. 10 illustrates a cut out side view of the bonded stack of FIG. 9 including a planarized insulating layer.

In some embodiments, a layer of insulating material is applied over the front side surface of the second substrate and the plurality of first die bonded to the front side surface. This insulating material is then planarized. FIG. 10 illustrates a cut out side view of the bonded stack of FIG. 9 including a planarized insulating layer 140 applied over the first die 110 and the surface 121. In some embodiments, the planarized surface can be patterned, etched, and metalized to form vertical and/or lateral metal interconnects with the first die or metal interconnects on the surface 121. In some embodiments, the insulating layer is not applied. Instead, each of the first die has a metalized back surface. An electrical lead can be connected to the metalized back surface.

The bonded stack is cut to form singulated die stacks. For example, a portion of the cuts are shown along lines A in FIG. 10. The cuts form die stacks 142. In the exemplary configuration of FIG. 10, each die stack 142 includes three die, the first die 110, the second die 122, and the die 132. Where each die stack includes a planarized surface and one or more solder balls on the opposite surface, the die stack can be easily tested by placing the die stack upside down on a flat surface and applying a test probe to the one or more solder balls.

In still other embodiments, a cap can be used instead of an insulating layer, such as the insulating layer 140 in FIG. 10. The cap is configured with cavities that are aligned with the plurality of first die bonded to the second substrate. In some configurations, the cap cavities are shaped to match the shape of the first die so as to provide an intimate contact between the cap cavity surface and the first die. In other configurations, the cap cavities are larger than the first die so as to leave an air gap between cap cavity surface and the first die when the cap is coupled to the second substrate.

The assembly process is described above as using the carrier substrate as an intermediate mechanism for temporarily holding the plurality of first die, where the carrier substrate is removed after the wafer bonding process is performed. In alternative embodiments, the carrier substrate is not an intermediate mechanism for temporally holding the plurality of first die. Instead, the carrier substrate is retained as part of the finished die package, which is subsequently cut to form singulated die stacks. In these embodiments, the carrier substrate is retained as a cap, as shown in FIG. 6, and subsequent process is performed with the carrier substrate remaining. For example, a finished bonded stack resembling the structure of FIG. 10 is formed, except that the insulating layer 140 in FIG. 10 is replaced by the carrier substrate 102.

Figure 11:
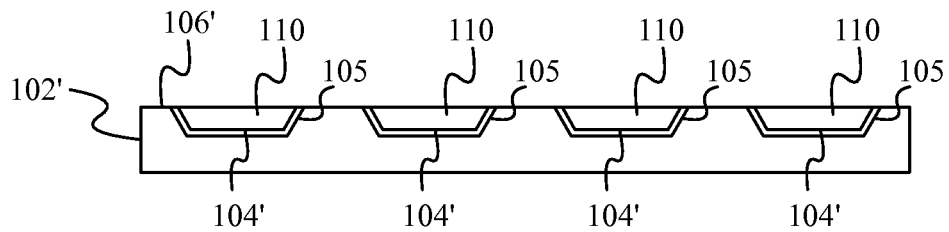
FIG. 11 illustrates a cut out side view of an adapted carrier substrate of FIG. 4 according to an embodiment.
Figure 12:
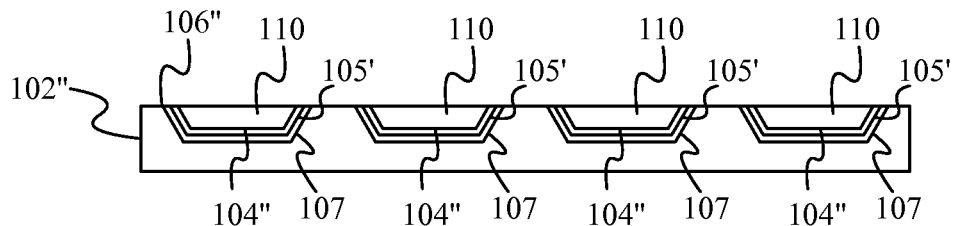
FIG. 12 illustrates a cut out side view of an adapted carrier substrate of FIG. 4 according to another embodiment.

Since the carrier substrate is retained as part of the finished package, the carrier substrate can be adapted to include additional structure and functionality. For example, prior to assembling the first die within the first cavities of the carrier substrate, the first cavities can be fabricated to include additional layers. FIG. 11 illustrates a cut out side view of an adapted carrier substrate of FIG. 4. The carrier substrate 102' includes a plurality of cavities 104'. One or more layers can be added using well known semiconductor fabrication techniques. In FIG. 11, a single additional layer 105 is added. The layer 105 can be an oxide isolation layer or a metal layer. FIG. 12 shows two layers 105' and 107 added to each cavity 104''. In an exemplary configuration, the layer 105' is a metal layer and the layer 107 is an oxide layer. The final shape of the cavities 104' including the layer 105, or the cavities 104'' including the layers 105' and 107, are configured so as to accept the first die, or other die, according to the assembly processes described above. In some embodiments, the carrier substrate and cavities are not adapted to include one or more additional layers, but instead the one or more additional layers are formed on the first die prior to be assembled in the cavities of the carrier substrate. In this case, the cavities are formed to accommodate the larger form factor of the first die including the one or more additional layers. In some embodiments, the carrier substrate including the additional layer(s) in the cavities is not bonded to a second substrate. Instead, the carrier substrate is cut to singulate the first die, or groups of first die. In this case, bumps can be added to the active circuitry side, or to the oppose side and coupled to the active circuitry using through silicon vias, prior to cutting the carrier substrate. Exemplary applications enabled by the one or more additional layers include, but are not limited to, electrical isolation of each die in a multiple die configuration, lateral optical isolation between a light emitting source and adjacent circuitry, and lateral and backside radio frequency shielding. In another exemplary application, the first die can be a power transistor, a first terminal of the power transistor is coupled to a metalized layer coupled to the backside of the die within the cavity, such as the metalized layer 105' in FIG. 12, and one or more source terminals are coupled to the top side (active circuitry) of the die. An oxide layer, such as the oxide layer 107 in FIG. 12, is formed between the metalized layer and the carrier substrate. This configuration can provide a pseudo-vertical DMOS structure. In yet another exemplary application, the power transistor example can be extended to include multiple power transistors configured laterally within the carrier substrate. In this case, there may be no need for an oxide layer or a back side metalized layer.

Figure 13:
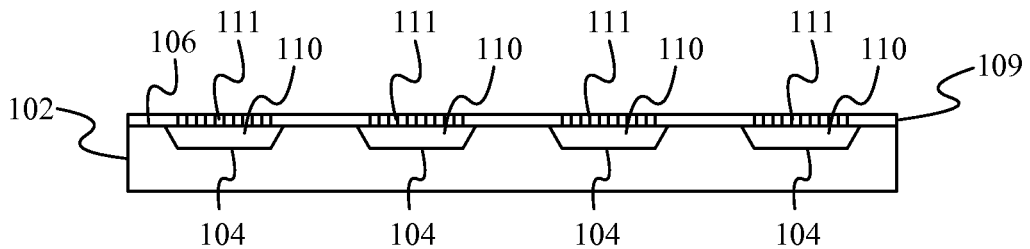
FIG. 13 illustrates the assembled carrier substrate of FIG. 4 including a planarized passivation layer and metal interconnects.
Figure 14:
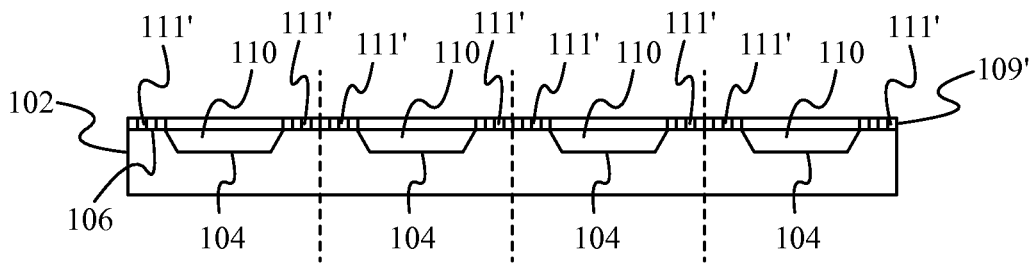
FIG. 14 illustrates the assembled carrier substrate of FIG. 4 including a redistribution layer added across the surfaces of each first die and the surface of the carrier substrate.

In the embodiments where the carrier substrate is retained as part of the finished package, additional processing can be performed. For example, once the cavities 104, 104', 104'' are filled with first die 110, a passivation layer can be deposited over the top surface 106, 106', 106'' and the exposed surface of each first die 110 to form a planarized surface. The planarized surface can be patterned, etched, and metalized to form high density vertical and/or lateral metal interconnects with the first die. FIG. 13 illustrates the assembled carrier substrate 102 of FIG. 4 including a planarized passivation layer 109 and metal interconnects 111. In the exemplary configuration of FIG. 13, the metal interconnects 111 are configured as vertical interconnects coupled to the surface 112 of the first die 110. In an alternative configuration, as shown in FIG. 14, a redistribution layer (RDL) 109' including metal interconnects 111' is added across the surface 112 of the first die and the surface 106 of the carrier substrate 102. The metal interconnects 111' re-route some or all of the interconnections from the area coinciding with the first die 110 to the area coinciding with the carrier substrate 102. This configuration is referred to as an interposer technology, or a fan out structure. The input/output (I/O) interface with the first die 110 is "fanned out" from the surface 112 of the first die 110 to the surface 106 of the carrier substrate 102. The carrier substrate top surface is used to expand the connection area to the active circuitry of the first die. The fan out structure is particularly useful when first die are used that are pad limited. The fan out structure is also useful when the first die material is more expensive than the carrier substrate material. Using the "real estate" of the less expensive carrier substrate as the fan out area is more cost effective than configuring the more expensive first die with fan out area. In some embodiments, the resulting carrier substrate is wafer bonded to a second substrate as previously described. During the subsequent wafer bonding process, the metal interconnects on the carrier substrate are bonded to corresponding metal interconnects of the plurality of second die on the second substrate. In other embodiments, the carrier substrate is not bonded to a second substrate. Instead, the carrier substrate is cut, such as along the dotted lines in FIG. 14, to singulate the first die, or groups of first die. In this alternative configuration, bumps can be added to the active circuitry side, or to the oppose side and coupled to the active circuitry using through silicon vias, prior to cutting the carrier substrate. In still other embodiments, the second substrate is replaced by a power FET wafer and the back side of the carrier substrate is coupled to the power FET wafer. In this configuration, the first die assembled in the carrier wafer functions as the control circuitry for the power FET. Gate connections to the power FETs are done through bond wires coupled to the first die. Preferably, the back side of the carrier substrate is coupled to the back side of the power FET wafer.

Similar modifications as described in relation to FIGS. 11-14 can be applied to the backside 123 of the substrate 120, the cavities 134 formed in the second substrate 120, and the plurality of second die 132. In some embodiments, the back side of the second substrate can be mounted to a lead frame to provide electrical connections.

As an alternative to placing a die into a second cavity on the back-side of the second substrate, a magnetic core can be positioned in the second cavity. Through the use of multiple TSVs, and metalization on the top and bottom surfaces of the second substrate, toroidal windings can be formed around the magnetic core to form a transformer. Application of the proper first die and second die, along with the transformer provide the elements of a power circuit. It is understood that the first die and second die are merely representative of other electrical device types that can be used. The other electrical device types can include, but are not limited to, flash memory devices or passive elements, such as inductors.

Figure 16:
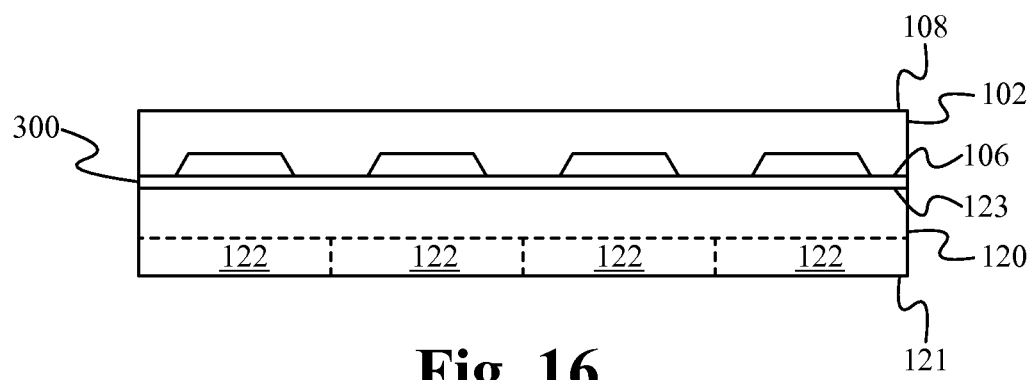
FIG. 16 illustrates a carrier substrate and a second substrate configured in a stacked die type configuration where an active side of the carrier substrate faces a back side of the second substrate.
Figure 17:
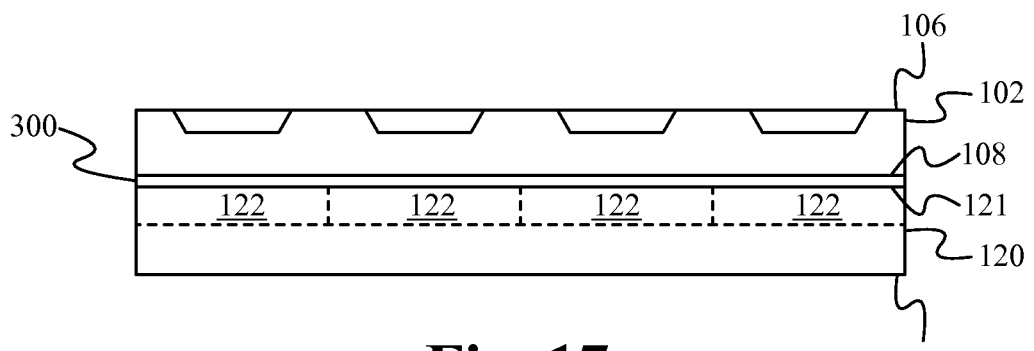
FIG. 17 illustrates a carrier substrate and a second substrate configured in a stacked die type configuration where an active side of the second substrate faces a back side of the carrier substrate.
Figure 18:
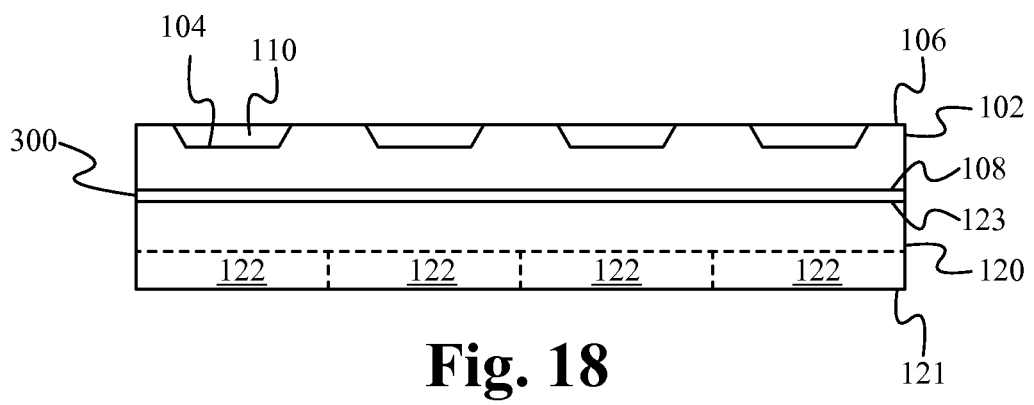
FIG. 18 illustrates a carrier substrate and a second substrate configured in a stacked die type configuration where back sides of the carrier substrate and the second substrate are configured facing each other.

Although the embodiments described above are directed to configurations where the active surfaces of the carrier substrate and the second substrate, such as surface 106 and surface 126, respectively, face each other, as in FIG. 6, alternative configurations are also contemplated. In some embodiments, the carrier substrate and the second substrate are configured in a stacked die type configuration where the active side of the carrier substrate faces the back side of the second substrate, as in FIG. 16, or the active side of the second substrate faces the back side of the carrier substrate, as in FIG. 17. In other embodiments, the back sides of the carrier substrate and the second substrate are configured facing each other, as in FIG. 18. In either configuration, the carrier substrate and the second substrate can be coupled using any conventional attachment technique, including, but not limited to, an adhesive 300. The active circuitry on the carrier substrate can be electrically connected to the active circuitry on the second substrate using similar techniques as in stacked die applications, such as using external connections on a printed circuit board or a lead frame of a chip package and/or interconnections via bond wires. Although not shown in FIGS. 16, 17, and 18, one or more interconnect layers can be formed over the active side of the carrier substrate and/or the second substrate. The one or more interconnect layers are electrically coupled to the active circuitry of the corresponding substrate, thereby providing conductive interconnects to the active circuitry. In some applications, through silicon vias (TSVs) can be used to interconnect the active circuitry, or the conductive interconnects connected to the active circuitry, of the carrier substrate and the second substrate. However, current technology has thickness limits for forming TSVs, and therefore the use of TSVs is limited by the thickness of the substrates. In some applications, the thickness of the carrier substrate, as in FIG. 17, the second substrate, as in FIG. 16, or the combined thickness of the carrier substrate and the second substrate, as in FIG. 18, prohibits the use of TSVs.

Figure 19:
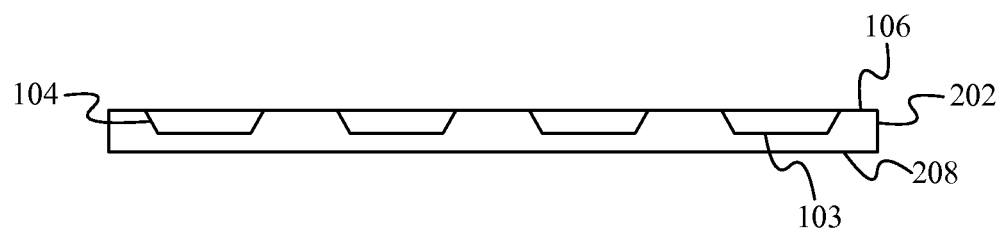
FIG. 19 illustrates a thinned carrier substrate according to a first embodiment.

Backlapping is a technique for reducing a thickness of a substrate, typically using a grinding process. Backlapping is also commonly referred to as wafer thinning or wafer backgrinding. In some embodiments, backlapping is applied to the carrier substrate, such as the carrier substrates in FIGS. 4, 11, 12, 13, and 14. Backlapping is applied to the back side surface 108 of the carrier substrate 102 until a desired thickness is achieved. In some embodiments, backlapping does not reach the bottom of the cavities 104, thereby leaving the entirety of the cavities 104 and the first die 110 positioned within completely intact, shown in FIG. 19 as thinned carrier substrate 202 where a backlapped back side surface 208 does not reach a bottom surface 103 of the cavities 104. In other embodiments, the backlapping is performed past the bottom surface 103 of the cavities 104 such that in addition to backlapping the carrier substrate 102, a bottom portion of the first die 110 positioned in each cavity 104 is also backlapped, shown in FIG. 20 as thinned carrier substrate 302 where a backlapped back side surface 308 extends into the cavities 104, thereby removing the bottom surface 103 of the cavities 104 and a portion of the back side of each first die 110. After backlapping, the back side of the backlapped first die 110' is exposed at the backlapped back side surface 308 of the thinned carrier substrate 302. Comparing the backlapped structures of FIGS. 19 and 20, the thinned carrier substrate 302 is thinner than the thinned carrier substrate 202. It is understood that backlapping can be performed to achieve other thicknesses. For example, the back side of the carrier substrate can be backlapped to the point of removing the bottom surface of the cavities but not removing any portion of the first die positioned within the cavities. In this manner, the bottom surface of the first die is exposed at the backlapped back side of the carrier substrate without removing any portion of the first die substrate.

In general, this technique can be applied to any type of substrate that has sufficient substrate excess thickness that can be removed without negatively impacting the remaining structure. The active circuitry side of the carrier substrate, the active circuitry side of the second substrate, or both can include one or more interconnect layers for providing conductive interconnects to the active circuitry. The one or more interconnect layers are formed using conventional semiconductor fabrication techniques and are preferably formed prior to backlapping. Alternatively, the one or more interconnect layers are formed after backlapping is performed. In this alternative case, one or more interconnect layers or a passivation layer can be formed on the backlapped surface of the substrate.

Figure 20:
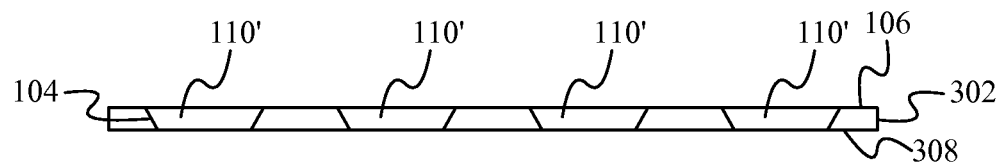
FIG. 20 illustrates a thinned carrier substrate according to a second embodiment.
Figure 21:
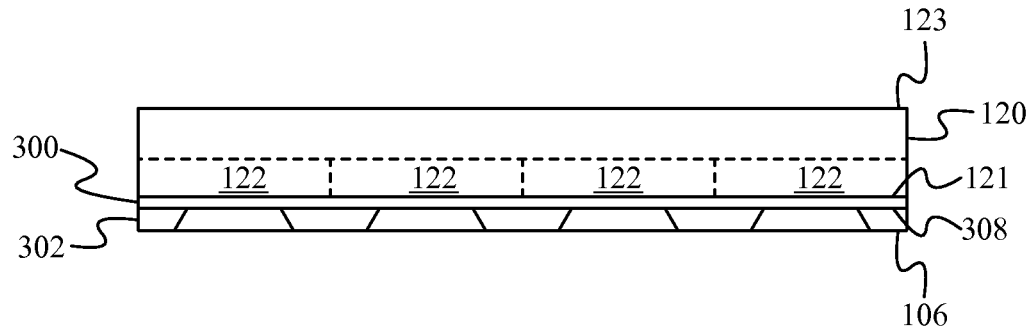
FIG. 21 illustrates a thinned carrier substrate attached to the second substrate.
Figure 22:
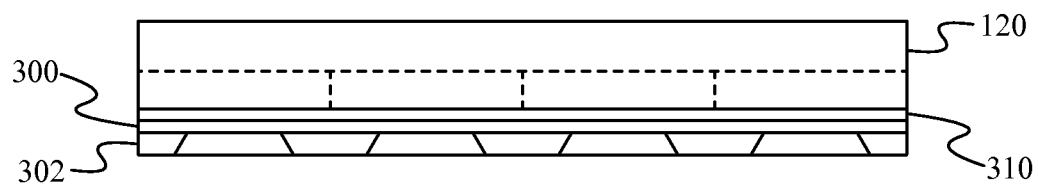
FIG. 22 illustrates a thinned carrier substrate having one or more interconnect layers attached to the second substrate.

The thinned carrier substrate 202, 302 can then be coupled to another structure. In some embodiments, the thinned carrier substrate 202, 302 is coupled to another substrate having an active surface, such as the second substrate 120 (FIG. 5) having second die 122 with active surface 121. FIG. 21 illustrates such a configuration in which the thinned carrier substrate 302 of FIG. 20 is attached to the second substrate 120. The back side 308 of the thinned carrier substrate 302 faces the active, front side surface 121 of the second substrate 120. In some embodiments, an adhesive 300 is used to attach the thinned carrier substrate 302 to the second substrate 120. Alternatively, other conventional techniques can be used to attach the thinned carrier substrate 302 to the second substrate 120. For example, the second substrate can be bonded to the thinned carrier substrate. FIG. 22 illustrates an alternative exemplary configuration in which one or more interconnect layers are formed on the active surface 121 prior to attachment to the thinned carrier substrate 301. Interconnect layer 310, which represents one or more interconnect layers, is formed over the active surface 121 of the second substrate 120, thereby providing conductive interconnects coupled to the active circuitry on the surface 121.

Figure 23:
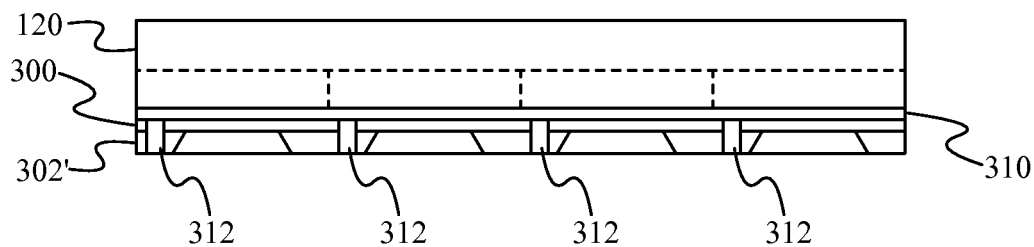
FIG. 23 illustrates a plurality of TSVs formed in the structure of FIG. 22.

To interconnect the active circuitry on the thinned carrier substrate 302 to the active circuitry on the second substrate 120, TSVs are formed through the substrate material of the thinned carrier substrate 302 and the adhesive 300. FIG. 23 illustrates a plurality of TSVs 312 formed through the thinned carrier substrate 302' and the adhesive 300 to interconnect with the conductive interconnects in the interconnect layer 310. Alternatively, the plurality of TSVs 312 are formed through the thinned carrier substrate 302' and the adhesive 300 to interconnect with the active surface 121, as in the configuration shown in FIG. 21. FIG. 23 shows one TSV formed for each die 110' assembled in the thinned carrier substrate 302. Alternatively, any number of TSVs can be formed to provide interconnections between the active side of the thinned carrier substrate 302 and the active side of the second substrate 120. In other embodiments, TSVs can alternatively be formed through the die 110, 110' instead of, or in addition to, forming TSVs through the thinned carrier substrate.

In the embodiments described above, the TSVs are formed in the thinned carrier substrate. In other embodiments, TSVs can alternatively be formed by first forming vias through a portion of the carrier substrate prior to backlapping. These partial TSVs are formed starting from the surface 106 and ending prior to reaching the opposite surface 108. The carrier substrate is then backlapped to at least the point where the vias bottom of the vias are formed, thereby exposing the opposite end of the partial TSVs.

Figure 24:
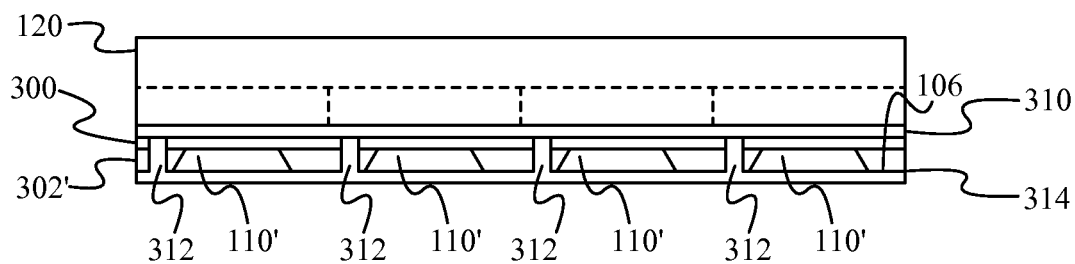
FIG. 24 illustrates one or more interconnect layers added to the structure of FIG. 23.

After the formation of the TSVs 312, one or more interconnect layers, represented as interconnect layer 314, are formed over the active side 106 of the thinned carrier substrate 302', thereby providing conductive interconnects coupling the TSVs 312 to the active circuitry of the first die 110', as shown in FIG. 24. In some embodiments, the interconnect layer also includes conductive interconnects and/or bumps for external connections. This composite structure can be subsequently cut to form singulated die stacks. Although the composite structure of FIG. 24 is configured having a single first die aligned with a single second die, alternative configurations are contemplated. For example, the die placements can be different than shown in the figures. Further, the ratio of first die to second die can be different than the one-to-one relationship shown. Still further, the die in the carrier substrate do not all have to be the same type, as in the first die 110. Different types of die can be used.

Although the composite structure shown in FIG. 24 is configured using the second substrate having a plurality of second die, other types of substrates can be used in place of the second substrate. In general, any substrate having an active side can be attached to the thinned carrier substrate. In some applications, the additional substrate has at least one active surface. The composite structure is particularly advantageous when a backlapped structure is coupled to another structure or substrate that is too thick for application of conventional through-via fabrication processes. In this case, the "thick" structure can be turned "upside-down" so that the active side is facing the backlapped structure, and these two structures can be coupled together using adhesive or other coupling means. An advantage in this case is that a through-via does not need to be formed through the thick structure but instead in the backlapped structure to connect the active devices on the backlapped structure to the active side of the thick structure.

An embodiment of a composite structure includes a thinned carrier substrate, a second substrate and a plurality of through-vias. The thinned carrier substrate includes a first side with a plurality of cavities formed therein and a plurality of singulated first die assembled into the plurality of cavities such that an active circuit front side of the first die is exposed at the first side. The thinned carrier substrate includes a second side opposite the first side. The second side is backlapped.

The second substrate has an active circuit first side and a second side opposite the active circuit first side. The second substrate is coupled to the thinned carrier substrate such that the backlapped second side of the thinned carrier substrate faces the active circuit first side of the second substrate. The plurality of through-vias form conductive interconnects between the active circuit front side of each of the plurality of first die assembled in the thinned carrier substrate and the active circuit first side of the second substrate.

In an embodiment, the second side of the thinned carrier substrate is backlapped to a thickness such that a bottom surface of each cavity is removed and the first die remains fully intact.

In an embodiment, one or more of the plurality of through-vias are formed through the thinned carrier substrate.

In an embodiment, one or more of the plurality of through-vias are formed through the first die assembled in the cavity.

In an embodiment, the composite structure includes one or more first interconnect layers formed on the front side of the plurality of first die and the first side of the thinned carrier substrate, wherein the one or more first interconnect layers include first conductive interconnects coupled to the plurality of first die and to the plurality of through-vias.

In an embodiment, the composite structure includes one or more second interconnect layers formed on the active circuit first side of the second substrate, wherein the one or more second interconnect layers include second conductive interconnects coupled to the active circuit first side of the second substrate, further wherein the plurality of through-vias are coupled to the second conductive interconnects.

In an embodiment, the composite structure includes an adhesive layer to couple the thinned carrier substrate to the second substrate.

In an embodiment, the plurality of through-vias are formed through the adhesive layer.

In an embodiment, the active circuit first side of the second substrate includes a plurality of second die fabricated therein.

In an embodiment, the second substrate includes a thinned second carrier substrate including a first side with a plurality of cavities formed therein and a plurality of singulated second die assembled into the plurality of cavities such that an active circuit front side of the second die is exposed at the first side of the thinned second carrier substrate. The thinned second carrier substrate includes a second side opposite the first side, the second side is backlapped to remove a bottom surface of the plurality of cavities and expose a back side of the second die at the backlapped second side of the second thinned carrier substrate.

In an embodiment, the composite structure includes one or more first interconnect layers formed on the front side of the plurality of first die and the first side of the thinned carrier substrate, wherein the one or more first interconnect layers include first conductive interconnects coupled to the plurality of first die and to the plurality of through-vias.

In an embodiment, the composite structure includes one or more second interconnect layers formed on the first side of the second thinned carrier substrate, wherein the one or more second interconnect layers include second conductive interconnects coupled to the active circuit front sides of the plurality of second die, further wherein the plurality of through-vias are coupled to the second conductive interconnects.

In an embodiment, the composite structure includes an adhesive layer to couple the thinned carrier substrate to the second thinned carrier substrate.

In an embodiment, the plurality of through-vias are formed through the adhesive layer.

In an embodiment, the plurality of first die are fabricated using a different technology than the plurality of second die.

In an embodiment, the thinned second carrier substrate includes another plurality of cavities formed on the first side and a plurality of singulated third die assembled into the other plurality of cavities such that an active circuit front side of the third die is exposed at the first side of the thinned second carrier substrate.

In an embodiment, the plurality of third die are fabricated using a different technology than the plurality of second die.

Figure 25:
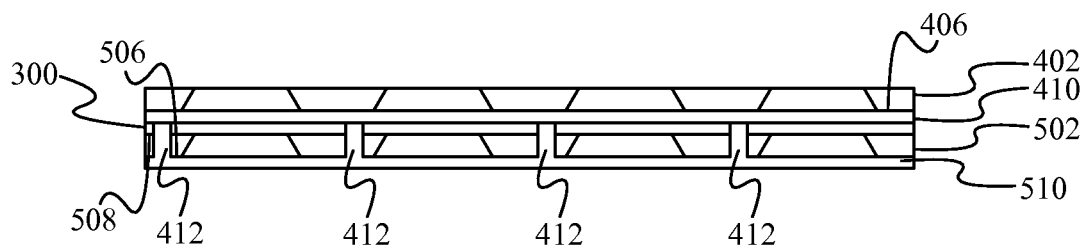
FIG. 25 illustrates an exemplary composite structure formed from two thinned carrier substrates.

In other embodiments, the second substrate can be replaced by another thinned carrier substrate such that two thinned carrier substrates are attached together and their active circuitry is interconnected. FIG. 25 illustrates an exemplary composite structure formed from two thinned carrier substrates. In the exemplary configuration shown in FIG. 25, the two thinned carrier substrates 402 and 502 have the same configuration, for example each thinned carrier substrate 402, 502 is configured similarly as the thinned carrier substrate 302 in FIG. 20. An interconnect layer 410 is formed on the active surface 406 of the thinned carrier substrate 402 and the thinned carrier substrate 402 with interconnect layer 410 is attached to the back side 508 of the thinned carrier substrate 502 using adhesive 300. A plurality of TSVs 412 are formed to interconnect the active surface 506 of the thinned carrier substrate 502 to the interconnect layer 410 of the thinned carrier substrate 402. An interconnect layer 510 is formed on the active surface 506 of the thinned carrier substrate 502. The interconnect layers and the TSVs can be formed in a similar manner as that described in relation to the interconnect layers and the TSVs in FIG. 24.

Figure 26:
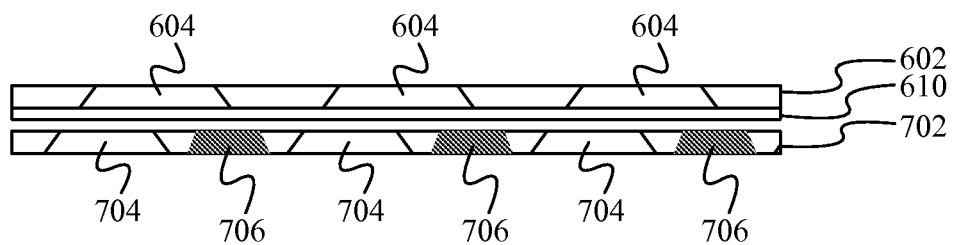
FIG. 26 illustrates two differently configured thinned carrier substrates that can be stacked and formed into a composite structure.

In the composite structure shown in FIG. 25, the die assembled in the thinned carrier substrate 402 are the same as the die assembled in the thinned carrier substrate 502. This need not be the case. For example, different types, sizes, shapes, and numbers of die can be assembled in the two thinned carrier substrates and/or within the same thinned carrier substrate. FIG. 26 illustrates two differently configured thinned carrier substrates that can be stacked and formed into a composite structure. A thinned carrier substrate 602 includes a plurality of die 604. Interconnect layer 610 is formed over the active surface of the thinned carrier substrate 602. A thinned carrier substrate includes a plurality of die 704 and a plurality of die 706. In this particular example, there are two die in the thinned carrier substrate 702 for every one die in the thinned carrier substrate 602. As shown in FIG. 26, neither of the die 704 or 706 in the thinned carrier substrate 702 are aligned with the die 604 in the thinned carrier substrate 602, but the repetition rate for the two die 704 and 706 is the same as that for the die 604. Alternative die placements are also contemplated, such as aligning either die 704 or 706 with the die 604. In the exemplary configuration shown in FIG. 26, the sizes of each of the die 604, 704, 706 are different. The types of technologies used to make each of the die 604, 704, 706 may or may not be the same, thereby enabling heterogeneous die types to be assembled within the same thinned carrier substrate and/or between the two thinned carrier substrate that are subsequently assembled into a heterogeneous stack of thinned carrier substrates. The two thinned carrier substrates 602, 702 can subsequently be assembled and interconnected using the methods previously described. In some embodiments, more than two thinned carrier substrates can be stacked and interconnected.

An advantage of the composite structure is that each thinned carrier substrate is substantially thinner than the original carrier substrate, thereby reducing an overall thickness of the composite structure. In some embodiments, the original carrier substrate thickness is about 100 microns or greater, and the thinned carrier substrate thickness is about 18 microns. Another advantage of using a thinned carrier substrate is that through-vias can be fabricated, whereas the original carrier substrate may have been too thick to form though-vias. In general, the thickness of the carrier substrates (or other substrates) is reduced to a point where conventional TSV technology can be applied, taking also into account the thickness of the intermediate adhesive layer used to attach one thinned carrier substrate to another. By using through-vias, multiple different heterogeneous thinned carrier substrates can be stacked and interconnected within a reduced form factor, where heterogeneous refers to types (technologies), sizes, shapes, and other disparate characteristics that distinguish one functional component assembled in a cavity on a thinned carrier substrate from another functional component assembled in another cavity on the same or different thinned carrier substrate.

The carrier substrate, the thinned carrier substrate, and the methodology for assembling and interconnecting multiple substrates enables the integration of heterogeneous technologies, die shapes, and die sizes. Further, a chip-filled carrier substrate can also be used as a means for increasing the overall yields and technology combinations for large area die. To accomplish this, the design and layout of a conceptual large area die is partitioned into segments, or modules. Each die module has a different design and is fabricated and singulated on a different wafer. Since the die modules are smaller in size than the original large area die, the die module yield is improved compared to the yield of the single large area die. So instead of the single large area die, multiple singulated die modules are designed and fabricated, then appropriately assembled in an array of cavities within a carrier substrate. The array of assembled die modules are interconnected with one or more interconnect layers to achieve the overall functionality of the single large area die. This approach is particularly advantageous for technologies where it is difficult to achieve sufficient yield for large area die. An example of such a technology is forming a graphene sheet on a top layer of a silicon wafer. Graphene, and other exotic materials, are difficult to produce in a consistent fashion on a silicon wafer.

Figure 27:
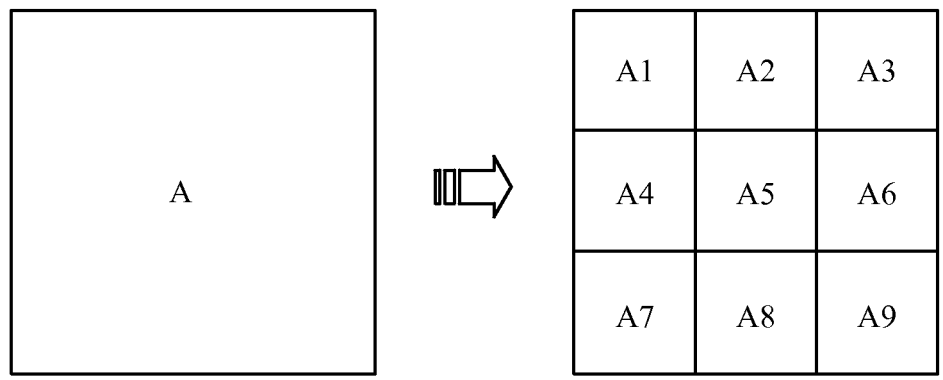
FIG. 27 illustrates the conceptual partitioning of a single large area die into a plurality of separate die modules.

FIG. 27 illustrates the conceptual partitioning of a single large area die into a plurality of separate die modules. In the example shown in FIG. 27, a single large area die A is conceptually partitioned into nine separate die modules A1-A9. It is understood that the single large area die can be partitioned into more or less than nine die modules. In implementation, the single large area die A is partitioned functionally and physically into the separate die modules A1-A9. A plurality of die modules A1 are fabricated and singulated from a wafer 1, a plurality of die modules A2 are fabricated and singulated from a wafer 2, and so on for each of the remaining die modules A3-A9. The good die modules A1 are selected from the batch of die modules A1 fabricated and singulated from the wafer 1. Good die modules are similarly selected for each of the other die modules A2-A9. The die modules A1-A9 can be made from the same technology or different technologies. FIG. 27 shows each die module A1-A9 being the same shape and size. In other embodiments, the shapes and sizes of each different die module can be different. In general, the technology, size, and shape of the die modules can be the same, different or some combination of similar and dissimilar die modules.

Figure 28:
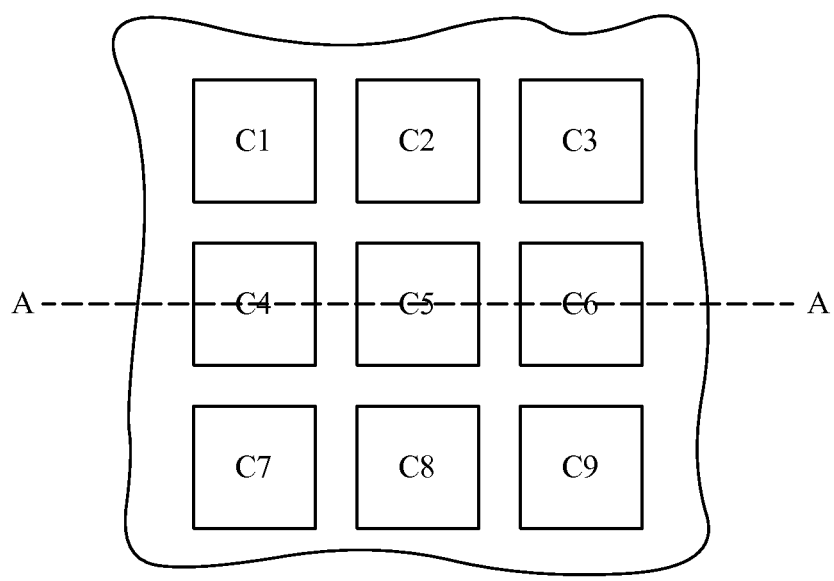
FIG. 28 illustrates a top down view of a portion of a carrier substrate configured with an exemplary array of cavities corresponding to the partitioned die modules of the single large area die A shown in FIG. 27.
Figure 29:
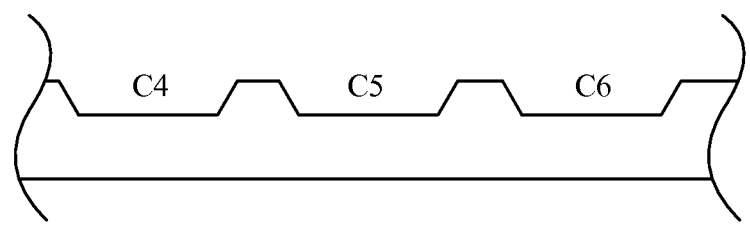
FIG. 29 illustrates a cut out side view of the carrier substrate of FIG. 28 along line A-A.

FIG. 28 illustrates a top down view of a portion of a carrier substrate configured with an exemplary array of cavities corresponding to the partitioned die modules of the single large area die A shown in FIG. 27. The exemplary array shown in FIG. 28 includes a 3×3 array of cavities C1-C9. FIG. 29 illustrates a cut out side view of the carrier substrate of FIG. 28 along line A-A. Although only a single 3×3 array of cavities is shown in FIG. 28, it is understood that a plurality of arrays can be formed in a single carrier substrate. Each of the cavities C1-C9 is shaped to receive a corresponding one of the die modules A1-A9. Specifically, die module A1 is positioned in cavity C1, die module A2 is positioned in cavity C2, and so on. Each of the cavities C1-C9 is a shaped cavity and each of the die modules A1-A9 is a shaped die formed to fit within a specifically shaped cavity of the carrier substrate. In some embodiments, each of the cavities and die modules has the same shape and size. In other embodiments, one, some or all of the cavities and corresponding die modules have different shapes and sizes. In some embodiments, the die modules are assembled into the corresponding cavities using a pick and place process. Alternatively, any conventional method for assembling the die modules into the proper cavities can be used.

Figure 30:
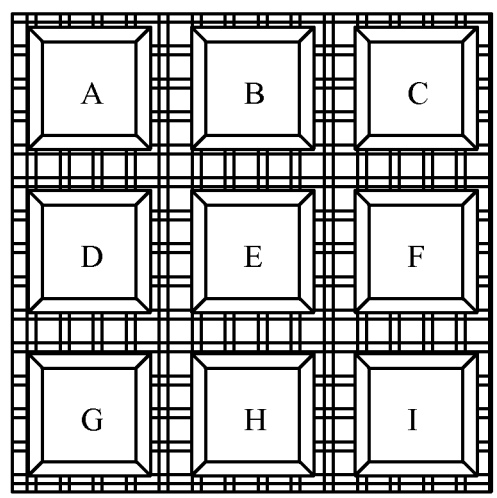
FIG. 30 illustrates the carrier substrate of FIG. 28 with the cavities filled with die modules.

Once the die modules A1-A9 are properly assembled into the nine-cavity array C1-C9, various die modules A1-A9 are interconnected using simple interconnects such as bond wires or through one or more interconnect layers that provide conductive interconnects between active circuitry on the die modules. FIG. 30 illustrates the carrier substrate of FIG. 28 with the cavities filled with die modules. The die modules A1-A9 are interconnected, as indicated by the crosshatched section shown in FIG. 30. For simplicity, interconnections to components external to the array are not shown. In some embodiments, the interconnects provide local routing between adjacent die modules. In other embodiments, the interconnects provide routing between non-adjacent die modules within the array. Each die module is patterned with fine line geometries and other typical characteristics of a semiconductor die. In some embodiments, the conductive interconnects formed by the one or more interconnect layers are not as fine pitch as the conductive interconnects on the active circuitry of the die modules. In this case, fine geometry processing is applied to the die modules and course geometry processing is applied to interconnect the die modules to each other and to external interconnects.

The completed interconnected array of die modules A1-A9 assembled in the carrier substrate performs the same overall functionality as the comparable single large area die A upon which the die modules A1-A9 are based. The yield is better for smaller sized die modules than for larger sized die fabricated using the same technology. This enables the yield of lower yield technologies to be increased. This concept is particularly advantageous for those larger area die that are suffering from unacceptable defect density, whether the technology involved is an exotic technology such as graphene sheets or a more standardized technology where improved yield is desirable. Conceptually, the larger area die is functionally and physically split into smaller components, or die modules, that can be fabricated with better yields than the larger area die, the smaller die modules are assembled into an array of cavities formed in the carrier substrate, and conductive interconnects are formed between die modules. The result is a larger area die assembly that has better defect density than the original larger area die because the smaller die modules are fabricated with improved yield.

Not only is this concept a yield improvement methodology, but it is a method of integrating heterogeneous technologies. The methodology described above related to die modules A1-A9 is used to replace the functionality of a monolithic die, the large area die A, where the individual die modules A1-A9 are fabricated using the same technology as the original large area die. However, each of the die modules need not be of the same type of technology. For example, some microprocessor applications require flash memory. Instead of burdening the microprocessor architecture to include flash memory, one of the die modules can be designed to have a specialized flash process that does not need to be compatible with the process used to form the remaining die of the microprocessor design other than being able to interconnect to it. This provides a method to construct very large integration devices using exotic technologies, or standard technologies. Examples of such heterogeneous integration includes the use of high power modules, low power modules, high frequency modules, low frequency modules, or other specialized processes integrated together.

Figure 31:
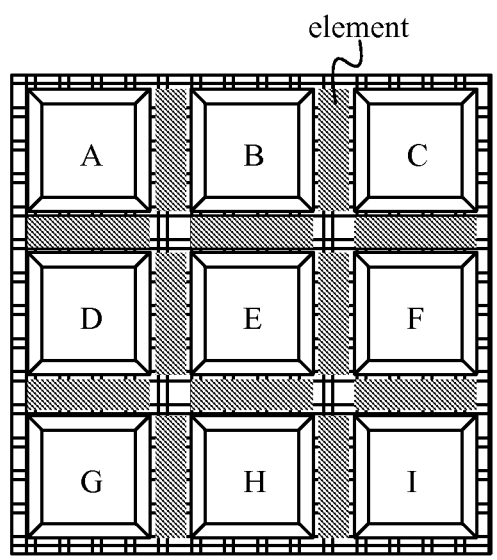
FIG. 31 illustrates the chip-filled carrier substrate of FIG. 30 including additional elements assembled between the die modules A1-A9.

In addition to, or instead of, forming conductive interconnects in the spaces between the chip-filled cavities, active or passive elements can be assembled into these spaces. FIG. 31 illustrates the chip-filled carrier substrate of FIG. 30 including additional elements assembled between the die modules A1-A9. The additional elements are conceptually represented as boxes B in FIG. 31. In some embodiments, the additional elements are fabricated on the carrier substrate prior to fabricating the cavities within the carrier substrate. In some embodiments, the additional elements can be shaped die placed in respective cavities, where these cavities are different than the cavities C1-C9 formed for the die modules A1-A9.

Die positioned within a cavity are exposed to physical contact stress which in some cases leads to adverse stress related effects on the die. In addition to the stress induced by the contact of the die to the cavity walls, a plastic mold compound is typically placed on a top surface of the packaged die. Plastic mold compound typically includes physical particles, which when placed on the die come in contact with the top surface of the packaged die. Each physical particle that contacts the top surface of the die creates a localized stress point, which can also result in stress related effects on the die. To overcome the stress applied to the die by the plastic mold compound, an intermediate protective layer, referred to as die coat, between the top surface of the die and the plastic mold compound. The protective layer has an elastic, conformable property that absorbs the contact stress from the particles in the plastic mold compound.

Referring to the chip-filled carrier substrate, the sizes and shapes of the die and the cavities into which the die are placed are described above as being effectively the same so that the die sides and bottom contact the cavity sides and bottom, thereby providing mechanical stability of the die within the cavity. In some applications the top surface of the die is co-planar with the top surface of the carrier substrate. In other applications the top surface of the die is slightly below the top surface of the carrier substrate.

Figure 32:
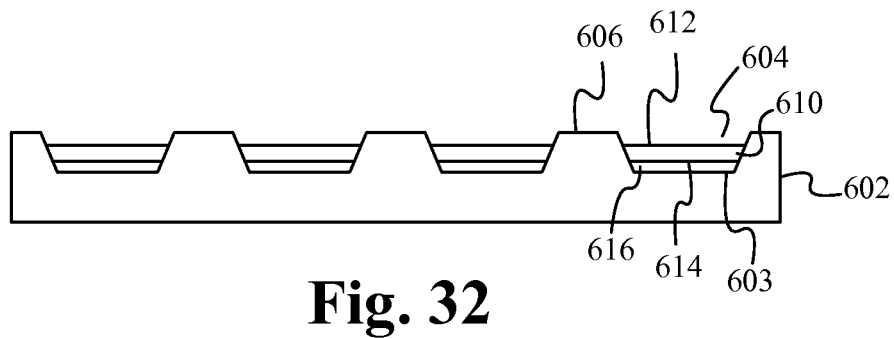
FIG. 32 illustrates a cut out side view of a carrier substrate including a plurality of cavities filled with shaped die that do not completely fill each cavity.

Alternatively, the die are shaped to have a thickness that is less than a depth of the cavity so that the die falls a distance into the cavity, but without the bottom surface contacting the bottom of the cavity. FIG. 32 illustrates a cut out side view of a carrier substrate 602 including a plurality of cavities 604 filled with shaped die 610. A shape of the die 610 matches a shape of the cavity 610, but a thickness of the die 610 is less than a depth of the cavity 604. In this manner, the die 610 fits within and falls into the cavity 604. The die 610 falls by an amount such that the sides of the die contact the sides of the cavity 610, or some intermediate material positioned on either the sides of the die, the sides of the cavity, or the sides of both the die and the cavity, but does not fall far enough for a bottom surface 614 of the die to contact a bottom surface 603 of the cavity 604. In this resting configuration, a gap 616 is formed between the bottom surface 614 of the die 610 and the bottom surface 603 of the cavity 604. In some embodiments, the thickness of the die 610 is such that when in the resting configuration, a top surface 612 of the die 610 is below a top surface 606 of the carrier substrate 602, as shown in FIG. 32. In other embodiments, the top surface of the die is co-planar with the top surface 606 of the carrier substrate 602. A shape of the die and a shape of the cavity allow for proper alignment of the die within the cavity. In some embodiments, the gap 616 can be filled with an epoxy, adhesive material, or other low stress material similar to the protective layer used in the die packages described above. The gap or gap filled material provides stress relief to the bottom surface 603 of the die 610. In other words, insolation from stress is provided to the bottom of the die. The side walls of the die 610 are still subject to stress due to contact with the side walls of the cavity 604.

In some embodiments, a patterned metalized layer can be formed over the top surface 606 of the carrier substrate 602 and the top surface 612 of the die 610 to form conductive interconnects coupled to the die 610. In some embodiments, a low stress material can be added on the top surface 612 of the die 610, or on top of any metalized layer formed on the top surface 612 of the die 610.

Figure 33:
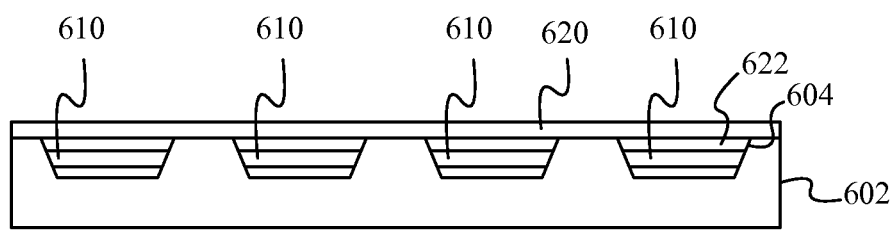
FIG. 33 illustrates the carrier substrate of FIG. 32 including a cap structure.

In some embodiments, the die 610 can be a MEMS (micro-electro-mechanical system) device, which by definition has one or more moving elements. The one or more moving elements can move within either the gap below or above the device 610 when positioned within the cavity 604. A cap 620 is placed over the cavity 604, thereby forming a gap 622 between the device 610 and the cap 620 within the cavity 604, as shown in FIG. 33. In some embodiments, the cap 620 is flat, as shown in FIG. 33. In other embodiments, the cap is shaped, such as a concave or arching structure, which forms a larger gap area. In some embodiments, the cap is a single piece that covers all cavities within the carrier substrate, as shown in FIG. 33. In other embodiments, multiple cap pieces are used, each cap piece covering one or more cavities. In some embodiments, all cavities are covered with a cap. In other embodiments, only select cavities are covered with a cap. In some embodiments, the cap is formed of a passive material, such as a silicon wafer. In other embodiments, the cap is some type of active die or wafer. In some embodiments, one or more interconnect layers are formed on at least one side surface of the cavity and the top surface of the carrier substrate, the one or more interconnect layers are coupled to the MEMS device. In some embodiments, the cap structure is formed over the one or more interconnect layers to cover the cavity yet provide an external interconnect to the MEMS device.

In some embodiments, certain MEMS devices require a closed environment in which to operate. The cap can be sealed to the carrier substrate around the cavity to form a hermetically sealed environment within the cavity. A controlled environment can be formed in this sealed cavity, for example creating a specific atmospheric pressure within the cavity.

The presently claimed invention has been described in terms of specific embodiments incorporating details to facilitate the understanding of the principles of construction and operation of the presently claimed invention. Such references, herein, to specific embodiments and details thereof are not intended to limit the scope of the claims appended hereto. It will be apparent to those skilled in the art that modifications can be made in the embodiments chosen for illustration without departing from the spirit and scope of the presently claimed invention.

What is claimed is:

1. A composite structure comprising:
  a thinned gallium arsenide carrier substrate including a first side with a plurality of cavities formed within the thinned carrier substrate, a plurality of singulated first die disposed within the plurality of cavities such that an active circuit front side of each of the plurality of singulated first die is exposed at the first side, and the active circuit front side of each of the plurality of singulated first die is coplanar with a surface of the first side of the thinned gallium arsenide carrier substrate, the thinned carrier substrate having a second side opposite the first side;
  a first conductive interconnect layer disposed upon the first side of the thinned gallium arsenide carrier substrate, the first conductive interconnect layer being in direct contact with the active circuit front side of each of the plurality of singulated first die, in direct contact with the surface of the first side of the thinned gallium arsenide carrier substrate, and having a planar configuration that is confined to the active circuit front side of each of the plurality of singulated first die;
  a thinned second gallium arsenide carrier substrate including a first side with a first plurality of cavities formed within the thinned second gallium arsenide carrier substrate and a plurality of singulated second die disposed within the first plurality of cavities such that an active circuit front side of each of the plurality of singulated second die is exposed at the first side of the thinned second gallium arsenide carrier substrate, and the active circuit front side of each of the plurality of singulated second die is coplanar with a surface of the first side of the thinned second gallium arsenide carrier substrate, the thinned second gallium arsenide carrier substrate having a second side opposite the first side;
  a second interconnect layer disposed upon the first side of the thinned second gallium arsenide carrier substrate, the second interconnect layer being in direct contact with the active circuit front side of each of the plurality of singulated second die;
  an adhesive layer between and in contact with the second side of the thinned second gallium arsenide carrier substrate and the first interconnect layer; and
  a plurality of through-vias extending from the first conductive interconnect layer, through the thinned second gallium arsenide carrier substrate and through the adhesive layer, to the second interconnect layer, forming conductive interconnects configured to electrically interconnect the active circuit front side of respective ones of the plurality of first die assembled in the thinned gallium arsenide carrier substrate with the active circuit front side of respective ones of the plurality of second die assembled in the thinned second gallium arsenide carrier substrate.

2. The composite structure of claim 1 wherein the adhesive layer configured to adhere the thinned gallium arsenide carrier substrate to the thinned second gallium arsenide carrier substrate is generally continuous over the second side of the thinned second gallium arsenide carrier substrate.

3. The composite structure of claim 1 wherein the plurality of first die are fabricated using a different technology than the plurality of second die.

4. The composite structure of claim 1, wherein the first side of the thinned second gallium arsenide carrier substrate further includes a second plurality of cavities formed within the thinned second gallium arsenide carrier substrate and a plurality of singulated third die disposed within the second plurality of cavities such that an active circuit front side of the third die is exposed at the first side of the thinned second gallium arsenide carrier substrate, wherein the plurality of third die are fabricated using a different technology than the plurality of second die.

5. The composite structure of claim 1 wherein the second interconnect layer is in direct contact with the surface of the first side of the thinned second gallium arsenide carrier substrate.

\* \* \* \* \*